(12) United States Patent
Tanzawa et al.

(10) Patent No.: US 6,222,773 B1
(45) Date of Patent: Apr. 24, 2001

(54) NONVOLATILE SEMICONDUCTOR MEMORY IN WHICH THE NUMBER OF PROGRAMMING OR ERASING BITS INCREASES WITH THE PROGRESS OF PROGRAMMING OR ERASING

(75) Inventors: Tooru Tanzawa, Ebina; Nobuaki Otsuka, Kawasaki; Hironori Banba, Kamakura; Shigeru Atsumi, Yokohama; Masao Kuriyama, Fujisawa; Seiichi Mori; Seiji Yamada, both of Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/592,661

(22) Filed: Jun. 13, 2000

Related U.S. Application Data

(62) Division of application No. 09/324,775, filed on Jun. 3, 1999, now Pat. No. 6,118,697.

(30) Foreign Application Priority Data

Jun. 3, 1998 (JP) .................................................. 10-154504

(51) Int. Cl.$^7$ .................................................. G11C 16/00
(52) U.S. Cl. ................................ 365/185.28; 365/185.23
(58) Field of Search ........................ 365/185.28, 185.23, 365/185.24, 185.25

(56) References Cited

U.S. PATENT DOCUMENTS

| 5,239,505 | | 8/1993 | Fazio et al. ..................... | 365/185.11 |
| 5,280,447 | | 1/1994 | Hazen et al. .................... | 365/185.11 |
| 5,301,144 | | 4/1994 | Kohno ............................ | 365/185.11 |
| 5,337,281 | * | 8/1994 | Kobayashi et al. .............. | 365/185.23 |
| 5,363,330 | * | 11/1994 | Kobayashi et al. .............. | 365/185.28 |
| 5,796,652 | * | 8/1998 | Takeshima et al. ............. | 365/185.23 |
| 6,128,231 | * | 10/2000 | Chung ............................ | 365/185.23 |

OTHER PUBLICATIONS

Akira Umezawa, et al., A 5–V–Only 0.6μm Flash EEPROM with Row Decoder Scheme in Triple–Well Structure, IEEE Journal of Solid–State Circuits, vol. 27, No. 11, p. 1540, Nov. 1992.

Toshikatsu Jinbo et al., A 5–V–Only 16–Mb Flash Memory with Sector Erase Mode, IEEE Journal of Solid–State Circuits, vol. 27, No. 11, p. 1547, Nov. 1992.

Johnny C. Chen et al., A 2.7V only 8Mbx16 NOR Flash Memory, 1996 Symposium on VLSI Circuits Digest of Technical Papers, p. 172, Jun. 1996.

* cited by examiner

Primary Examiner—Tan T. Nguyen
(74) Attorney, Agent, or Firm—Banner & Witcoff, Ltd.

(57) ABSTRACT

A NOR type flash memory includes a plurality of word lines, a plurality of bit lines, at least one bit line, a plurality of nonvolatile memory cells, a row decoder, a cell selection circuit and a programming load. Each of the plurality of nonvolatile memory cells includes a gate electrode, drain electrode and source electrode and the gate electrode is connected to a corresponding one of the plurality of word lines, the drain electrode is connected to a corresponding one of the plurality of bit lines and the source electrode is connected to the source line. The row decoder selects one of the plurality of word lines at the time of data programming. The cell selection circuit includes a column decoder and column gates and is constructed to simultaneously select one bit line from each of the plurality of groups among the plurality of bit lines. The programming load increases the number of programming bits with the progress of programming when data of plural bits is programmed into a plurality of memory cells simultaneously selected by the cell selection circuit.

6 Claims, 22 Drawing Sheets

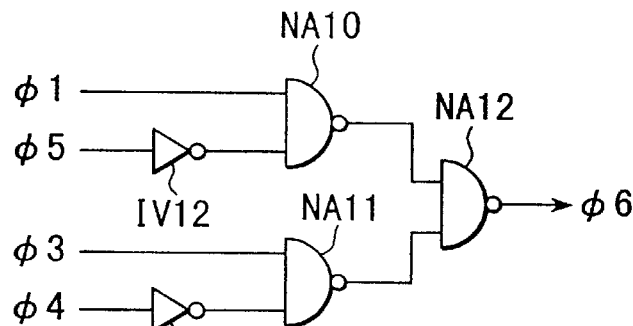
FIG. 12A  LOGIC CIRCUIT
(PART OF SIGNAL GENERATING CIRCUIT 37)
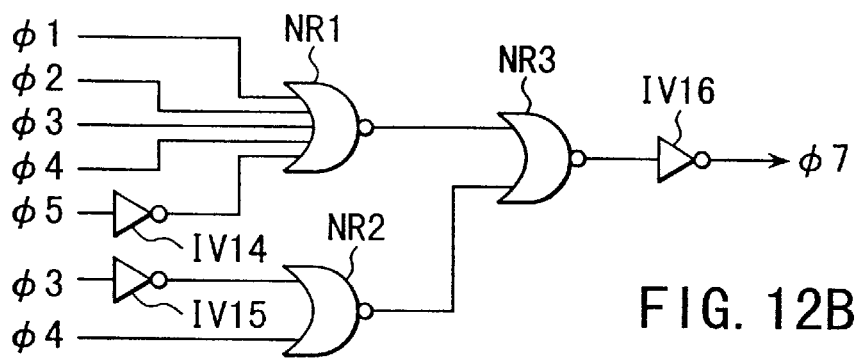
FIG. 12B  LOGIC CIRCUIT
(PART OF SIGNAL GENERATING CIRCUIT 37)
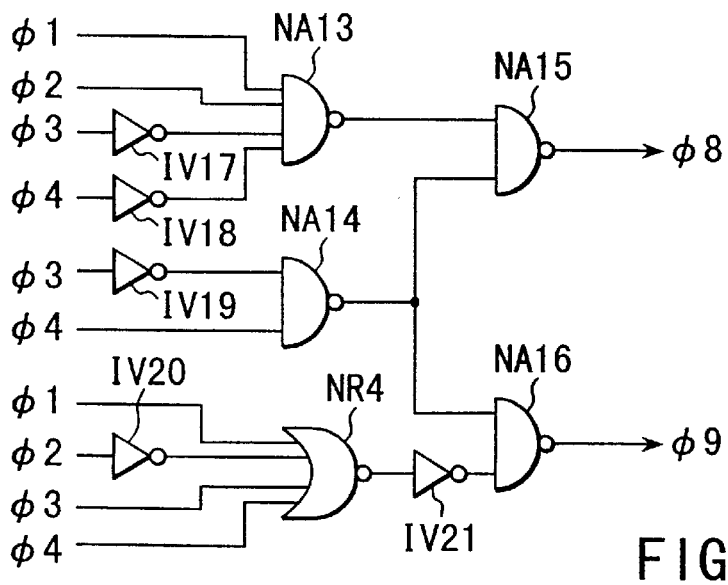
FIG. 12C  LOGIC CIRCUIT
(PART OF SIGNAL GENERATING CIRCUIT 37)

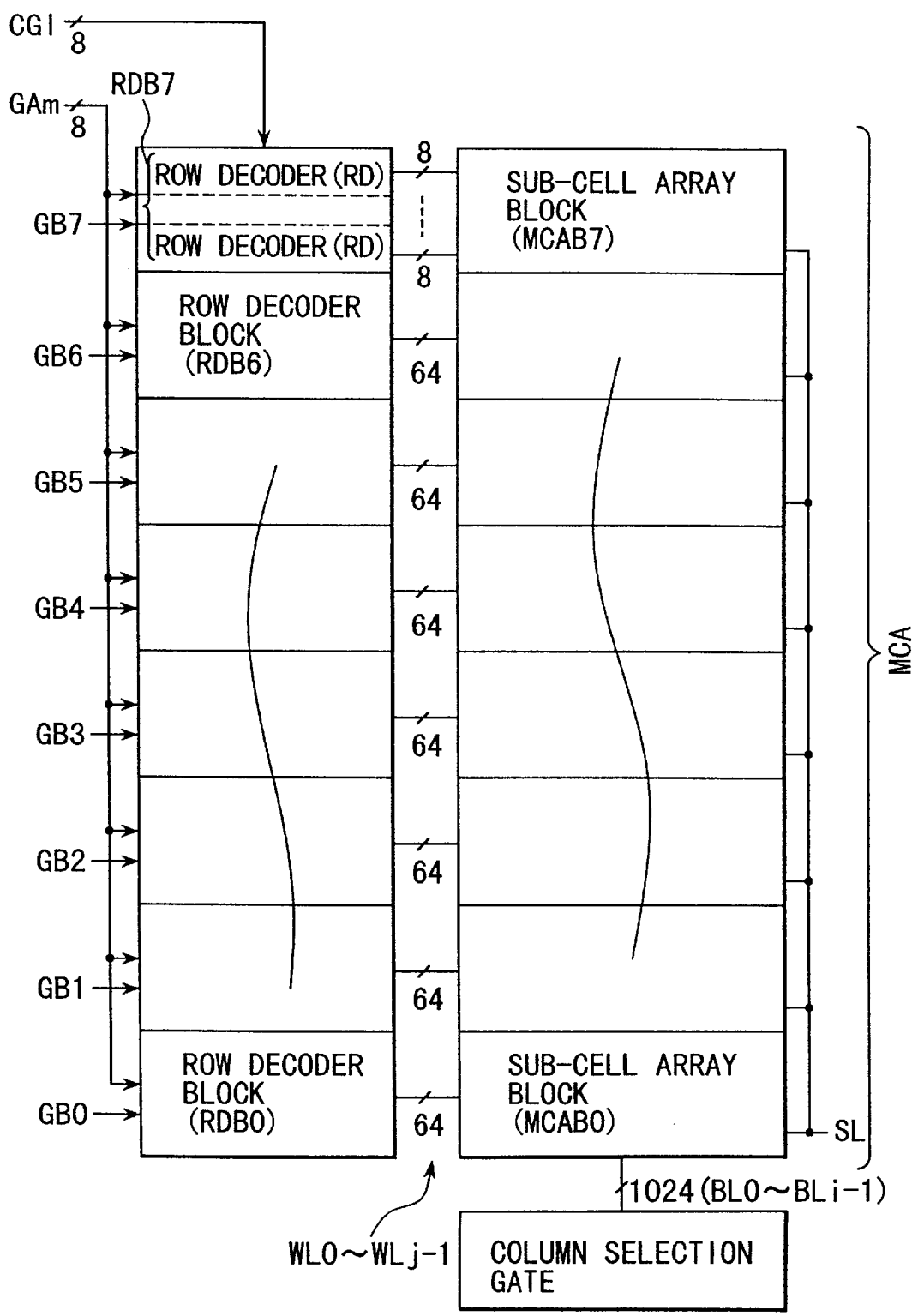
F I G. 22

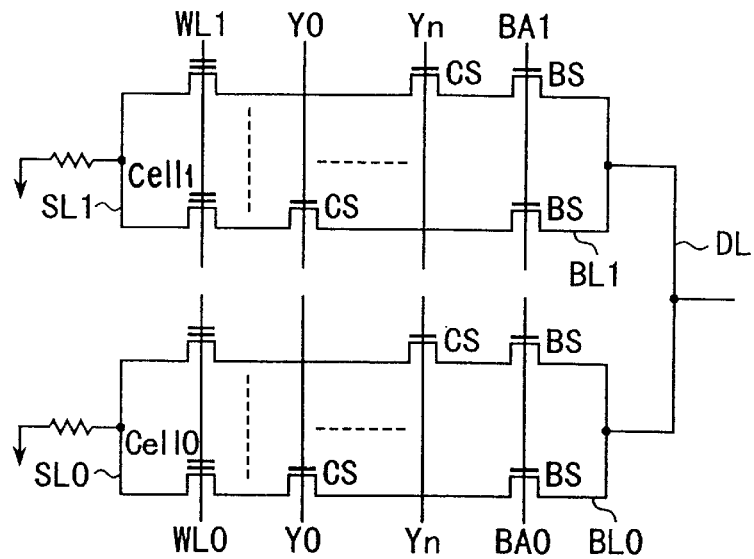
FIG. 38
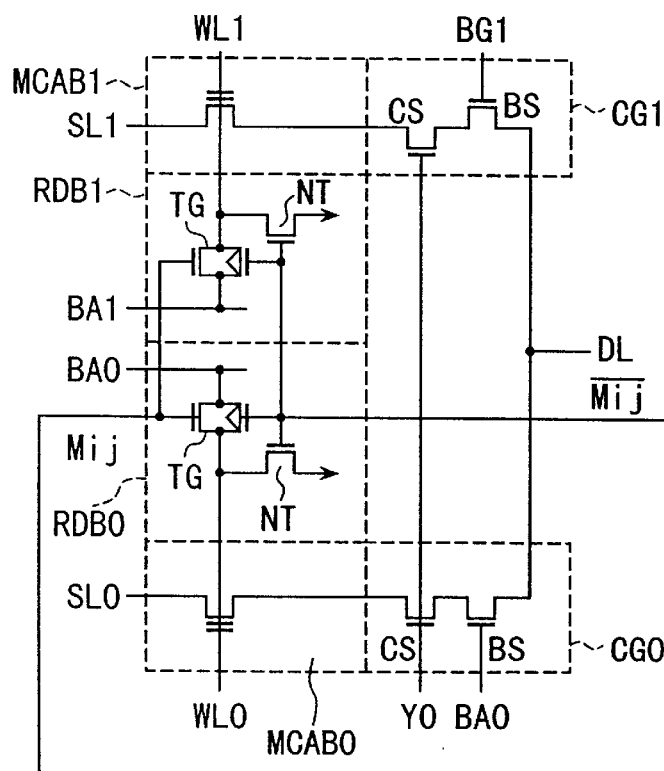
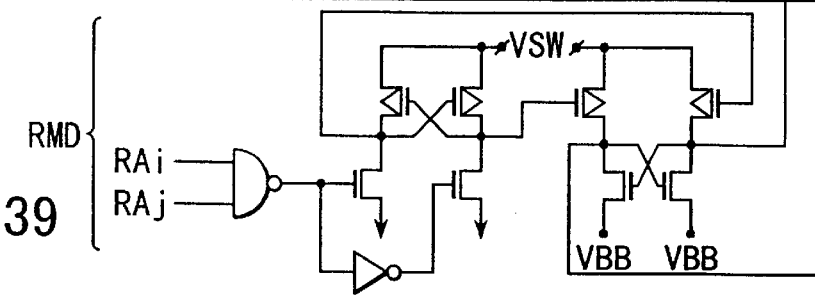
FIG. 39

NONVOLATILE SEMICONDUCTOR MEMORY IN WHICH THE NUMBER OF PROGRAMMING OR ERASING BITS INCREASES WITH THE PROGRESS OF PROGRAMMING OR ERASING

This application is a Divisional of U.S. application Ser. No. 09/324,775 now U.S. Pat. No. 6,118,697, filed on Jun. 3, 1999.

BACKGROUND OF THE INVENTION

This invention relates to a nonvolatile semiconductor memory and more particularly to an electrically erasable programmable semiconductor memory (EEPROM) which can be used in a NOR type flash memory, for example.

As an EEPROM including memory cells each of which has a gate structure having a floating gate and a control gate stacked thereon to store data "0" or "1" in a nonvolatile fashion by changing the number of electrons stored in the floating gate, a NOR type flash memory is known, for example. The flash memory includes a memory cell array having memory cells arranged in an array form and data stored in the memory cells can be simultaneously erased for the whole memory cell array or for each block unit.

This type of NOR type flash memory is described in IEEE JOURNAL OF SOLID-STATE CIRCUIT, VOL. 27, NO. 11, NOVEMBER 1992 pp. 1540–1545, Umezawa et al. "A 5-V-Only Operation 0.6 μm Flash EEPROM with Row Decoder Scheme in Triple-Well Structure" and IEEE JOURNAL OF SOLID-STATE CIRCUIT, VOL. 27, NO. 11, NOVEMBER 1992 pp. 1547–1553, Jinbo et al. "A 5-V-Only 16-Mb Flash Memory with Sector Erase Mode", for example.

FIGS. 1A to 1C schematically show the structure of the memory cell in the NOR type flash memory. FIG. 1A is a pattern plan view, FIG. 1B is a cross sectional view taken along the 1B—1B line of FIG. 1A and FIG. 1C is a cross sectional view taken along the 1C—1C line of FIG. 1A.

As shown in FIGS. 1A to 1C, an N-type well 1b is formed in a P-type semiconductor substrate 1a and a P-type well 1c for forming a cell area is formed in the N-type well 1b. A cell array is formed on the P-type well 1c. An element isolation insulating film 2 is disposed over the main surface of the substrate 1a to electrically isolate the memory cells. A gate oxide film 3 is formed over the main surface of the substrate 1a (on the P-type well 1c) isolated by the element isolation insulating film 2. A floating gate 4 of each cell is formed on the gate oxide film 3 of the cell. An insulating film (an insulating film between the floating gate and the control gate) 6 is formed on the floating gate 4. A control gate 5 of the cell is formed on the insulating film 6 to cover the floating gates of the adjacent cells. An inter-level insulating film 7 is formed on the resultant semiconductor structure. A bit line 8 is formed on the inter-level insulating film 7 to extend in a direction intersecting the control gate 5. A drain region (n-type diffusion layer) 9 and a source region (n-type diffusion layer, source line) 10 of the cell are separately formed in the P-type well 1c below the stacked gate structure. A through hole 12 is formed in the inter-level insulating film 7 on the drain region 9 to permit the drain region 9 and the bit line 8 to be connected at a bit contact portion 11.

As described above, the memory cell has the drain 9, source 10, floating gate 4 and control gate 5 and stores data by changing the amount of charges stored in the floating gate 4.

FIG. 2 is a circuit diagram showing an example of the construction of a memory cell array having memory cells which are the same in construction as the memory cell shown in FIGS. 1A to 1C arranged in a matrix form.

The gate electrodes of memory cells MC00 to MCn0, MC01 to MCn1, . . . , or MC0m to MCnm on the same row are connected to a corresponding one of word lines WL0 to WLn, the drain electrodes thereof on the same column are connected to a corresponding one of bit lines BL0 to BLm, and the source electrodes thereof are commonly connected to a source line SL.

Among the NOR type flash memory, a memory of plural-bit configuration for simultaneously inputting/outputting data of plural bits with respect to the exterior at the time of data programming/data readout is provided and a memory of 16-bit configuration having the bit width of 16 is known as one example.

In the NOR type flash memory of plural-bit configuration, the same cell array block is divided into N groups in the unit of plural columns. Memory cells of the N groups are selected by use of the same row selection signal at the time of data readout/data programming and one memory cell is selected from the memory cells of each of the N groups by use of a column selection signal so that N memory cells can be simultaneously selected.

FIG. 3 shows an extracted part of the cell array block in the NOR type flash memory of plural-bit configuration and an extracted part of a peripheral circuit associated therewith.

Bit lines are divided into groups BL0 to BL15, . . . each including four bit lines, for example, one-side ends of the current paths of column selection transistors CS are respectively connected to one-side ends of the four bit lines of each of the groups BL0 to BL15, . . . and the other ends of the current paths of the four column selection transistors CS are commonly connected to make a common bit line. The common bit line is connected to one end of a bit line load (bit line load transistor) LT, an input terminal of a sense amplifier SA, one end of the current path of a programming transistor WT and the like via the current path of a bit line potential clamping transistor CT. The other ends of the current paths of the bit line load transistor LT and programming transistor WT are connected to power supplies.

In the NOR type flash memory of plural-bit configuration, each of the bit lines BL0 to BL15 and BL16 to BLm in FIG. 2 corresponds to one of the four bit lines of each of the groups BL0 to BL15, . . .

When data re-programming is effected for a memory cell in the NOR type flash memory, in order to prevent occurrence of a phenomenon (disturb at the time of re-programming of data) that another memory cell commonly using the bit line or word line with the memory cell for data re-programming is set into a half-selected state and the data storing state thereof is changed, the word line/bit line is separated for each block unit to be erased. The block unit to be erased is generally 512 kbits and, for example, a cell block array of 1 k word lines×512 bit lines configuration or 512 word lines×1 kbit lines configuration is used.

Next, the data programming, readout and erasing operations in the NOR type flash memory with the above construction are explained.

(1) When the memory cells MC00 to MC015 are selected at the time of data programming, a voltage of Vpp (a voltage of approx. 10V) is applied to the selected word line WL0 commonly used by the memory cells MC00 to MC015 and the other non-selected word lines WL1 to WLn are set to 0V.

Bit line voltages applied to the selected bit lines BL0 to BL15 respectively connected to the selected memory cells MC00 to MC015 depend on programming data, and Vdp (a voltage of approx. 5V) is applied to the bit line corresponding to data "0" to be programmed and 0V is applied to the bit line corresponding to data "1" to be programmed. The source line SL is set at 0V.

Thus, in the selected memory cell into which data "0" is programmed among the selected memory cells MC00 to MC015, the gate is set at Vpp and the drain is set at Vdp. Among the electrons moving from the source to the drain, some electrons have a large amount of energy so as to reach the floating gate by the electric field in the gate direction. Then, the "1" data state in which the number of electrons in the floating gate is relatively small is changed into the "0" data state in which the number of electrons in the floating gate is relatively large.

In the memory cells having the gate voltage-drain voltage relation different from the above relation (in the non-selected memory cell and the selected memory cell into which "1" data is programmed), no drain current flows and data in the memory cell is not changed.

(2) When the memory cells MC00 to MC015 are selected at the time of data readout, Vcc (a voltage of approx. 5V) is applied to the selected word line WL0 commonly used by the above memory cells and the other non-selected word lines WL1 to WLn are set to 0V.

Bit line voltages applied to the selected bit lines BL0 to BL15 respectively connected to the selected memory cells MC00 to MC015 are set to Vd (a voltage of approx. 1V) by use of the bit line clamping transistor and 0V is applied to the non-selected bit lines. The source line SL is set at 0V.

At this time, since the threshold voltage of the memory cell in the "1" data state among the selected memory cells MC00 to MC015 is lower than Vcc and the threshold voltage of the memory cell in the "0" data state is higher than Vcc, a current flows in the "1" cell and no current flows in the "0" cell. "0" data or "1" data can be read out by sensing a voltage corresponding to the above current by use of the sense amplifier.

(3) The erase operation is simultaneously effected for a selected array block at the time of data erasing (one type of data programming). In this case, a method for applying an erase voltage to the source line SL of the block to be erased and a method for applying an erase voltage to the cell well of the block to be erased are provided.

The former erase method is effected by setting all of the word lines in the block to be erased to 0V or less and applying a high erase voltage to the source line SL. Thus, a high electric field is applied to the gate oxide film of an overlapping portion between the source region and the floating gate in all of the memory cells in the block to be erased and electrons in the floating gate pass into the source region by tunneling so that data in all of the memory cells will become "1".

In the non-selected cell array block, all of the word lines are set at 0V and the source line SL is set at 0V, and therefore, data of the memory cells will not disappear.

The latter erase method is effected by setting all of the word lines in the block to be erased to 0V and applying a high erase voltage to the P-type well and N-type well. Thus, a high electric field is applied to the gate oxide film between the well and the floating gate in all of the memory cells in the block to be erased and electrons in the floating gate pass into the well so that data in all of the memory cells will become "1".

In the non-selected cell array block, all of the word lines are set at 0V and the wells are set at 0V, and therefore, data of the memory cell will not disappear.

In order to form the power supply of the flash memory which requires an erase voltage and a programming voltage higher than the power supply voltage (approx. 5V) as a single power supply and realize the flash memory with the single power supply, a booster circuit for raising the programming voltage and a booster circuit for raising the erase voltage are provided in the chip.

The pattern areas required for causing the booster circuits to have necessary current supply abilities and the currents consumed in the operations thereof depend on the ratio of the programming/erase voltage and the power supply voltage.

It is required to lower the operation voltage of the flash memory, but if the programming/erase voltage cannot be lowered, the pattern area required for the booster circuit increases, and as a result, the current consumed increases. Therefore, in the conventional NOR type flash memory, the area of the programming voltage booster circuit and the consumption current are increased. The reason is described below.

FIG. 4 shows a characteristic of a change in the threshold voltage with the programming time in each memory cell MCi and FIG. 5 shows a characteristic of a change in the programming current (drain current) with the programming time.

As is clearly understood from the characteristic diagrams of FIGS. 4 and 5, the threshold voltage of the memory cell is low at the initial time of programming, and therefore, the drain current becomes large (the initial value thereof is 450 $\mu$A).

The conventional programming method is to simultaneously program programming bits of a bit width into a plurality of memory cells of the same cell array block and since a large programming current flows particularly when "0" data is programmed into all of the selected memory cells, the area required for the programming voltage booster circuit to fully supply the above current and the consumption current are increased.

As a method for reducing the area of the programming voltage booster circuit and the consumption current, for example, a method for reducing the area of the programming voltage booster circuit and the consumption current by half by dividing the programming bits into two portions and simply time-dividing the programming operation like the programming signals shown in FIG. 6 is proposed. For example, this technique is described in 1996 Symposium on VLSI Circuits Digest of Technical Papers, pp. 172–173, June 1996, J C Chen et al. "A 2.7V only 8 Mb×16 NOR Flash Memory.

That is, the method is to reduce the number of bits to be simultaneously programmed to half (8) of the bit width so as to reduce the current supply ability required for the programming voltage booster circuit by half in the NOR type flash memory of the bit width 16. However, if the technique is used, the programming time is doubled.

In the conventional NOR type flash memory, the area of the erase voltage booster circuit and the consumption current are increased and the reason is described below.

FIG. 7 shows a characteristic of a change in the threshold voltage with the erase time in each memory cell MCi and FIG. 8 shows a characteristic of a change in the erase current (source current) with the erase time.

As is clearly understood from the characteristic diagrams of FIGS. 7 and 8, the threshold voltage of the memory cell is high and an electric field in the tunnel oxide film is high at the initial time of erasing and the band-band tunnel current is large (4 mA at maximum).

Further, in order to sufficiently supply the band-band tunnel current, the size of the erase voltage booster circuit is so determined as to set the supply current of the erase voltage booster circuit to the maximum value of 4 mA corresponding to the initial value of the band-band tunnel current. Therefore, the area required for the erase voltage booster circuit and the consumption current are increased.

In this case, since the erase size is determined to 512 kbits by the specification, the necessary supply current in the conventional simultaneous erase method cannot be reduced.

In the conventional NOR type flash memory, if a plurality of memory cells in the same cell array block are simultaneously selected at the time of data programming and data is simultaneously programmed, the drain currents (programming currents) of the cells to be simultaneously programmed are concentrated on the source line SL common for the cells, and therefore, if the number of bits to be simultaneously programmed is increased, the source line potential rises by the parasitic resistance of the common source line SL and the maximum number of bits which can be simultaneously programmed is determined by the programmable critical source voltage Vc, and thus, a problem that the number of bits to be simultaneously programmed is limited occurs. The problem is described below.

FIG. 9 schematically shows one example of part of a cell array block in the conventional NOR type flash memory and column gates (column selection transistors and block selection transistors).

The cell array block includes a plurality of memory cells MC arranged in a matrix form (in this example, cells of only one row are extracted and shown as a representative for brevity of the drawing). A word line WLi is commonly connected to the control gates of the memory cells of the same row and a bit line BLi is commonly connected to one-side ends of the memory cells of the same column. In other words, desired two memory cells of the same row or the same column commonly use the word line or bit line.

Each bit line is serially connected to the current paths of the column selection transistor and the block selection transistor and a data line DL is commonly connected to one-side ends of the current paths of the block selection transistors for every preset number of bit lines.

In the above NOR type flash memory, one or a plurality of memory cells of the cell array block are simultaneously selected at the time of data readout, programming or erase.

The memory cells to be simultaneously programmed are present in the same cell array block and the column selection signal and block selection signal for the selected column are set to the "H" level.

In this case, the drain currents (programming currents) of the cells to be simultaneously programmed are concentrated on the common source line SL at the time of data programming, and therefore, if the number of bits to be simultaneously programmed in the same cell array block is increased, the source line potential rises by the parasitic resistance Rs of the common source line SL and the maximum number of bits which can be simultaneously programmed is determined by the programmable critical source voltage Vc. Thus, the number of bits to be simultaneously programmed is limited.

That is, if the number of bits to be simultaneously programmed is excessively large, the source potential of the memory cell rises and the drain current becomes difficult to flow, and as a result, the programming characteristic is deteriorated.

Further, holes generated in the programming operation become difficult to flow by the resistance of the P-type well in which the memory cells are formed and the potential of the P-type well rises to cause the punch-through phenomenon.

Therefore, in the case of programming test, the erase time for each bit is short since the erase operation is simultaneously effected for the cell array block, but the programming time for each bit becomes long because of the restriction on the number of bits which can be simultaneously programmed and an increase in the test time causes the test cost to rise.

As described above, in the conventional nonvolatile semiconductor memory, since a large programming current flows particularly when "0" data is programmed into all of the selected memory cells in a case where programming bits of the bit width are simultaneously programmed into a plurality of memory cells of the same cell array block, a problem that the area required for the programming voltage booster circuit to sufficiently supply the above current and the consumption current are increased occurs.

Further, in the conventional simultaneous erase method and there occurs a problem that a necessary supply current becomes large and the area required for the programming voltage booster circuit and the consumption current are increased.

The test time becomes long because of the restriction on the number of bits which can be simultaneously programmed, and as a result, a problem that the test cost rises occurs.

BRIEF SUMMARY OF THE INVENTION

Accordingly, an object of this invention is to provide a nonvolatile semiconductor memory capable of reducing the programming time and suppressing the area required by the programming voltage booster circuit and the consumption current when programming bits of the bit width are programmed into a plurality of memory cells of the same cell array block.

Further, another object of this invention is to provide a nonvolatile semiconductor memory capable of reducing a supply current of the erase voltage booster circuit to a value smaller than the initial value of the band-band tunnel current in the case of simultaneous erase and suppressing the area required by the erase voltage booster circuit and the consumption current.

Further, still another object of this invention is to provide a nonvolatile semiconductor memory capable of alleviating the restriction on the number of bits to be simultaneously programmed, reducing data programming test time and suppressing the test cost.

The above object can be attained by a nonvolatile semiconductor memory according to a first aspect of this invention, comprising a plurality of word lines; a plurality of bit lines; at least one source line; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to the source line; a cell selection circuit connected to the bit lines, and for selecting one of the plurality of word lines and simultaneously selecting one bit line from each of a plurality of groups among the plurality of bit lines at the time of data programming; transistors each connected to the bit lines of each of the plurality of groups;

and programming circuit for increasing the number of programming bits with the progress of programming when data of a plurality of bits is programmed into a plurality of memory cells which are simultaneously selected by the cell selection circuit, the programming circuit connected to the column gate.

The above object can be attained by a nonvolatile semiconductor memory according to a second aspect of this invention, comprising a plurality of word lines; a plurality of bit lines; a source line; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to the source line; an address pre-decoder for pre-decoding an input address; a row decoder for receiving a pre-decode signal pre-decoded and selecting one of the plurality of word lines; and erase circuit for respectively dividing the row decoder and the plurality of word lines into N ($\geq 2$) groups of first to Nth row decoder blocks and first to Nth word line blocks at the time of erasing of data stored in the plurality of memory cells and individually selecting the first to Nth word line blocks to time-divide a data erase operation into first to Nth erase operations and effect the data erase operation; wherein the erase circuit sets the source line to a preset potential, enables the selection logic for the pre-decode signal to set all of the row decoders in the selected row decoder block corresponding to the selected word line block selected from the first to Nth word line blocks into a selected state and sets the potentials of all of the word lines of the selected word line block to a first negative voltage with respect to the source line potential, and enables the non-selection logic for the pre-decode signal to set all of the row decoders in the non-selected row decoder block other than the selected row decoder block into a non-selected state and sets the potentials of all of the word lines of the non-selected word line block other than the selected word line block to a second voltage having an absolute value smaller than the first negative voltage with respect to the source line potential.

The above object can be attained by a nonvolatile semiconductor memory according to a third aspect of this invention, comprising a plurality of word lines; a plurality of bit lines; a source line; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to the source line; an address pre-decoder for pre-decoding an input address; a row decoder for receiving a pre-decode signal pre-decoded and selecting one of the plurality of word lines; and erase circuit for respectively dividing the row decoder and the plurality of word lines into N ($\geq 2$) groups of first to Nth row decoder blocks and first to Nth word line blocks at the time of erasing of data stored in the plurality of memory cells, individually selecting the first to Nth word line blocks to time-divide a data erase operation into first to Nth erase operations and effect the data erase operation and then selecting all of the word line blocks to simultaneously erase data; wherein the erase circuit sets the source line to a preset potential, enables the selection logic for the pre-decode signal to set all of the row decoders in the selected row decoder block corresponding to the selected word line block into a selected state and sets the potentials of all of the word lines of the selected word line block to a first negative voltage with respect to the source line potential, and enables the non-selection logic for the pre-decode signal to set all of the row decoders in the non-selected row decoder block other than the selected row decoder block into a non-selected state and sets the potentials of all of the word lines of the non-selected word line block other than the selected word line block to a second voltage having an absolute value smaller than the first negative voltage with respect to the source line potential in a case where data of the selected word line block individually selected from the first to Nth word line blocks is erased, and enables the selection logic for the pre-decode signal to set all of the row decoders in all of the row decoder blocks into a selected state with the source line potential kept at the preset potential and sets the potentials of all of the word lines of all of the word line blocks to the first negative voltage with respect to the source line potential in a case where all of the word line blocks are selected to simultaneously erase data.

The above object can be attained by a nonvolatile semiconductor memory according to a fourth aspect of this invention, comprising a plurality of word lines; a plurality of bit lines; a plurality of source lines; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to a corresponding one of the plurality of source lines; an address pre-decoder for pre-decoding an input address; a row decoder for receiving a pre-decode signal pre-decoded and selecting one of the plurality of word lines; and erase circuit for dividing the plurality of source lines into first to Nth ($\geq 2$) source lines at the time of erasing of data stored in the plurality of memory cells and individually selecting the first to Nth source lines to time-divide a data erase operation into first to Nth erase operations and effect the data erase operation; wherein the erase circuit enables the selection logic for the pre-decode signal to set all of the row decoders into a selected state, sets the potentials of all of the word lines to a preset potential, sets the potential of the selected source line individually selected from the first to Nth source lines to a first positive voltage with respect to the word line potential, and sets the potential of the non-selected source line other than the selected source line to a second voltage having an absolute value smaller than the first positive voltage with respect to the word line potential.

The above object can be attained by a nonvolatile semiconductor memory according to a fifth aspect of this invention, comprising a plurality of word lines; a plurality of bit lines; a plurality of source lines; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to a corresponding one of the plurality of source lines; an address pre-decoder for pre-decoding an input address; a row decoder for receiving a pre-decode signal pre-decoded and selecting one of the plurality of word lines; and erase circuit for dividing the plurality of source lines into first to Nth ($\geq 2$) source lines at the time of erasing of data stored in the plurality of memory cells, individually selecting the first to Nth source lines to time-divide a data erase operation into first to Nth erase operations and effect the data erase operation and then simultaneously erasing data of all of the memory cells; wherein the erase circuit enables the selection logic for the pre-decode signal to set all of the row decoders into a selected state, sets the potentials of all of the word lines to a preset potential, sets the potential of the selected source line individually selected from the first to Nth source lines to a first positive voltage with respect to the word line potential and sets the potential of the non-selected source line other than the selected source line to a second voltage having an absolute value smaller than the first positive voltage with respect to the word line potential in a case where the first to Nth source lines are individually selected to erase data, and sets the potentials of all of the source lines to the first positive voltage with respect to the word line potential with all of the word lines kept at the preset potential in a case where data in all of the memory cells is simultaneously erased.

The above object can be attained by a nonvolatile semiconductor memory according to a sixth aspect of this invention, comprising a plurality of word lines; a plurality of bit lines; a plurality of source lines; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to a corresponding one of the plurality of source lines; an address pre-decoder for pre-decoding an input address; a row decoder for receiving a pre-decode signal pre-decoded and selecting one of the plurality of word lines; and erase circuit for dividing the plurality of word lines into first to Mth ($\geq 2$) word line blocks and dividing the plurality of source lines into first to Nth ($\geq 2$) source lines at the time of erasing of data stored in the plurality of memory cells, and individually selecting (1, 1)th to (M, N)th blocks each depending on the combination of an individually selected one of the first to Mth word line blocks and an individually selected one of the first to Nth source lines to time-divide a data erase operation into (1, 1)th to (M, N)th erase operations and effect the data erase operation; wherein the erase circuit enables the selection logic for the pre-decode signal to set all of the row decoders corresponding to the selected word line block into a selected state, sets the potentials of all of the word lines of the selected word line block to a first voltage, sets the potentials of all of the word lines of the non-selected word line block to a second voltage higher than the first voltage, sets the potential of the selected source line to a third voltage higher than the first voltage and sets the potential of the non-selected source line to a fourth voltage lower than the third voltage.

The above object can be attained by a nonvolatile semiconductor memory according to a seventh aspect of this invention, comprising a plurality of word lines; a plurality of bit lines; a plurality of source lines; a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to a corresponding one of the plurality of source lines; an address pre-decoder for pre-decoding an input address; a row decoder for receiving a pre-decode signal pre-decoded and selecting one of the plurality of word lines; and erase circuit for dividing the plurality of word lines into first to Mth ($\geq 2$) word line blocks and dividing the plurality of source lines into first to Nth ($\geq 2$) source lines at the time of erasing of data stored in the plurality of memory cells, individually selecting (1, 1)th to (M, N)th blocks each depending on the combination of an individually selected one of the first to Mth word line blocks and an individually selected one of the first to Nth source lines to time-divide a data erase operation into (1, 1)th to (M, N)th erase operations and effect the data erase operation, and then simultaneously erasing data in all of the memory cells; wherein the erase circuit enables the selection logic for the pre-decode signal to set all of the row decoders corresponding to the selected word line block into a selected state, sets the potentials of all of the word lines of the selected word line block to a first voltage, sets the potentials of all of the word lines of the non-selected word line block to a second voltage higher than the first voltage, sets the potential of the selected source line to a third voltage higher than the first voltage and sets the potential of the non-selected source line to a fourth voltage lower than the third voltage in a case where the (1, 1)th to (M, N)th blocks are individually selected to erase data, and sets the potentials of all of the word lines to the first voltage and sets the potentials of all of the source lines to the third voltage in a case where data in all of the memory cells is simultaneously erased.

The above object can be attained by a nonvolatile semiconductor memory according to an eighth aspect of this invention, comprising a memory core section having a plurality of cell array blocks each including a plurality of nonvolatile memory cells, a plurality of word lines and a plurality of bit lines; and means for simultaneously programming data into a plurality of memory cells in one of the cell array blocks at the time of first data programming and simultaneously programming data into the plurality of memory cells in the plurality of cell array blocks at the time of second data programming; wherein the bit line is selected by use of an address decode signal for selectively specifying the column address in the cell array block and a block selection signal for selectively specifying the cell array block and the word line is selected by use of an address decode signal for selectively specifying the row address in the cell array block and the block selection signal for selectively specifying the cell array block.

The above object can be attained by a nonvolatile semiconductor memory according to a ninth aspect of this invention, comprising a memory core section having a plurality of cell array blocks each including a plurality of nonvolatile memory cells, a plurality of word lines and a plurality of bit lines; and means for simultaneously erasing data in the plurality of memory cells in one of the cell array blocks and simultaneously programming data into the plurality of memory cells in the plurality of cell array blocks; wherein the bit line is selected by use of an address decode signal for selectively specifying the column address in the cell array block and a block selection signal for selectively specifying the cell array block and the word line is selected by use of an address decode signal for selectively specifying the row address in the cell array block and the block selection signal for selectively specifying the cell array block.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 12A to 12C are circuit diagrams showing an example of the construction of part of the signal generating circuit shown in FIG. 10;

FIG. 22 is a block diagram showing an example of the construction of a cell array block in a NOR type flash memory and a row decoder associated therewith, for illustrating a nonvolatile semiconductor memory according to a second embodiment of this invention;

FIG. 38 is a circuit diagram schematically showing an example of the construction of two cell array blocks and two column gates in the circuit shown in FIG. 37;

FIG. 39 is a circuit diagram showing an example of the connection relation of a row decoder, cell array block and column gate in the circuit shown in FIG. 37;

DETAILED DESCRIPTION OF THE INVENTION

First, the outline of this invention relating to the data programming operation of a NOR type flash memory is explained.

Figure 4:
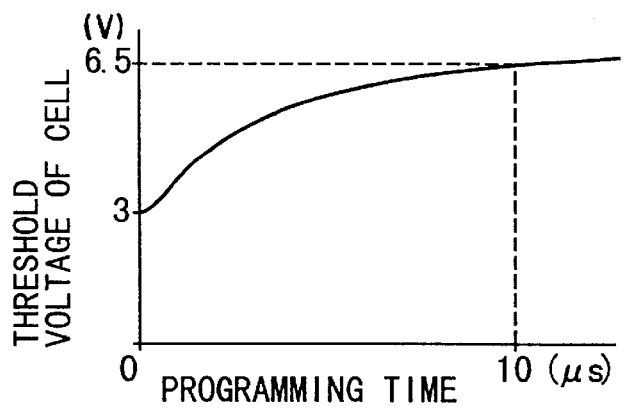
FIG. 4 is a characteristic diagram showing the characteristic of a change in the threshold voltage with programming time in a memory cell of the NOR type flash memory.
Figure 5:
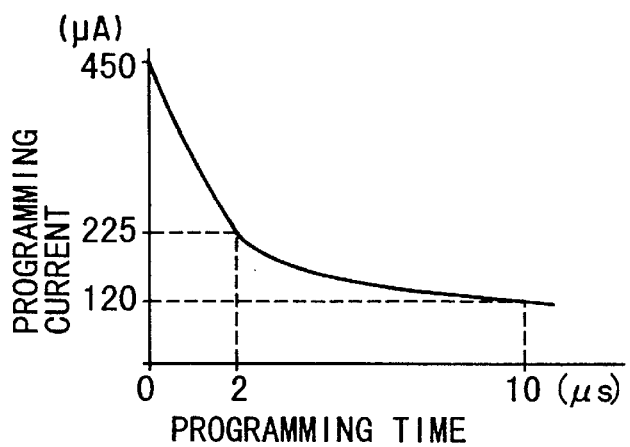
FIG. 5 is a characteristic diagram showing the characteristic of a change in the programming current (drain current) with programming time in a memory cell of the NOR type flash memory.

As is clearly understood from the characteristic of a change in the threshold voltage with programming time of a memory cell shown in FIG. 4 and the characteristic of a change in the programming current with programming time of a memory cell shown in FIG. 5, the threshold voltage of the memory cell is low at the initial programming time, and therefore, the drain current is large and the drain current decreases with the progress of the programming operation. The initial value of the drain current is 450 $\mu$A, the drain current after an elapse of 2 $\mu$s from the start of the programming operation is 225 $\mu$A, and the threshold voltage after an elapse of 10 $\mu$s from the start of the programming operation is 6.5V ("0" data).

In the nonvolatile semiconductor memory of this invention, a plurality of memory cells simultaneously selected are divided into N ($\geq$2) groups at the time of data programming, and data is programmed by dividing the programming period into a first programming period (for example, a period of time in which the programming current of the memory cell decreases to half the initial value thereof) in which data is serially programmed in a first period of time with the memory cells of each group dealt as one unit and a second programming period (preferably, a period of time longer than the first time) in which data is serially programmed in a period of second time with the memory cells of two or more groups dealt as one unit.

That is, an attempt is made to reduce the programming time by programming data according to a sequence which is designed to increase the number of programming bits with the progress of programming.

(First Embodiment)

This embodiment is different from the conventional NOR type flash memory in the circuit for generating a programming control signal and a programming control method (sequence) and this embodiment is explained with emphasis placed on the difference.

Figure 10:
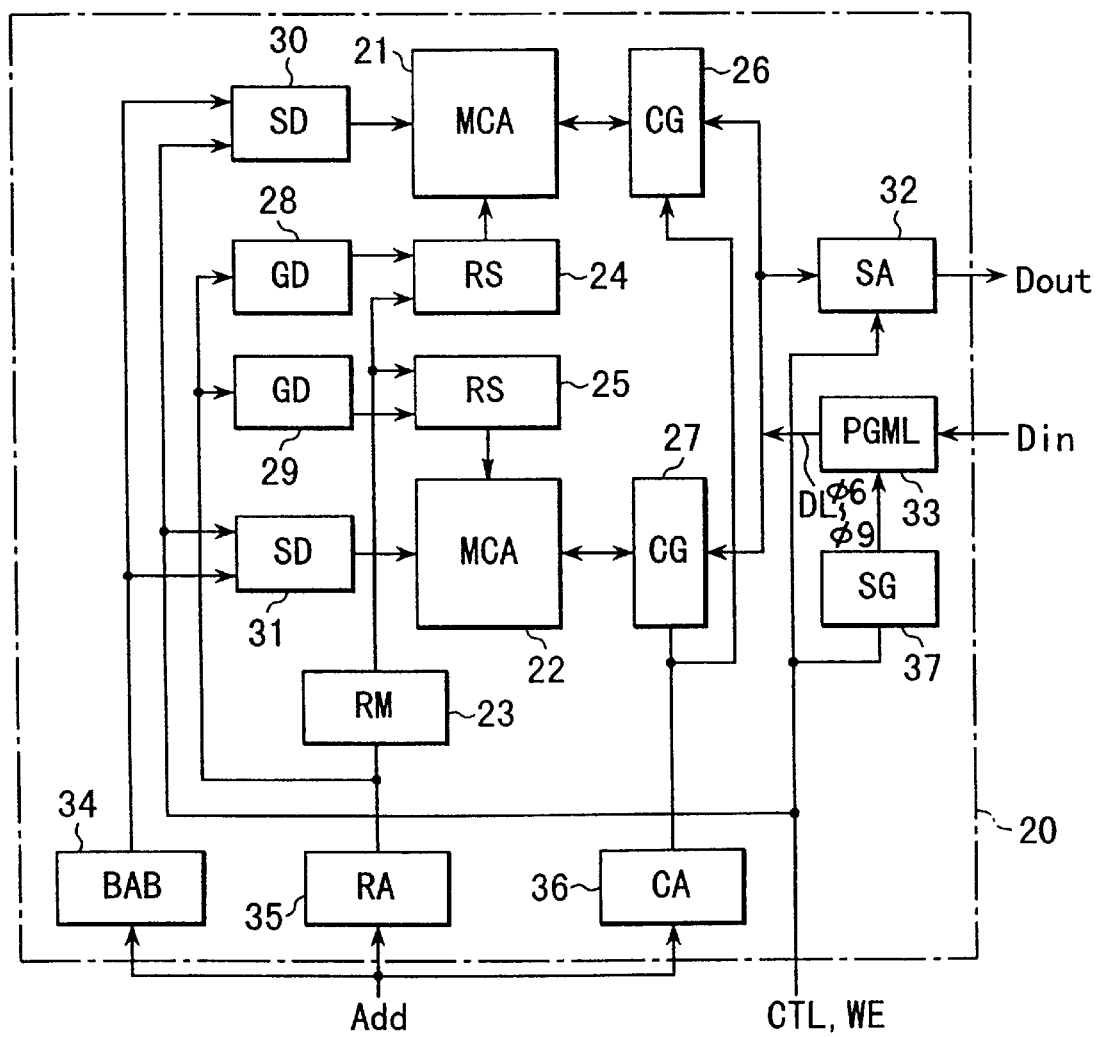
FIG. 10 is a block diagram showing the schematic construction of a NOR type flash memory, for illustrating a nonvolatile semiconductor memory according to a first embodiment of this invention.

FIG. 10 is a block diagram showing the schematic construction of a NOR type flash memory of 16-bit configuration, for illustrate a nonvolatile semiconductor memory according to the first embodiment of this invention. A memory 20 includes a plurality of (two in this example) memory cell arrays (MCA) 21, 22 of 512 kbit size. A row decoder includes a row main decoder (RM) 23 and row sub-decoders (RS) 24, 25. Each of column gates (CG) 26, 27 is constructed in a tree form. One of word lines in the memory cell arrays, 21, 22 is selected by the row-sub decoder 24 or 25 selected by the row main decoder 23. A control gate driver (GD) 28 or 29 respectively biases the word line in the memory cell array 21 or 22. A source driver (SD) 30 or 31 respectively biases the common source line in the memory cell array 21 or 22. A sense amplifier (SA) 32 senses and amplifies cell data read out from the memory cell array 21 or 22 via the column gate 26 or 27 and outputs the amplified data to the exterior of the memory 20 as an output signal Dout. A programming load (PGML) 33 outputs a programming voltage corresponding to programming data Din input from the exterior of the memory 20 to the bit line of the memory cell array 21 or 22 via the column gate 26 or 27. A block address buffer (BAB) 34 creates an internal memory cell array block address based on an address corresponding to a memory cell array block address among an address signal Add input from the exterior of the memory 20. A row address buffer (RA) 35 creates an internal row address based on an address corresponding to a row address among the address signal Add. A column address buffer (CA) 36 creates an internal column address based on an address corresponding to a column address among the address signal Add. A signal generation circuit (SG) 37 generates various signals in response to a write enable signal WE input from the exterior of the memory 20 and supplies programming control pulse signals ø6 to ø9 to the programming load 33.

Various control signals CTL and a write enable signal WE are input from the exterior of the memory 20 and the control signals CTL are used for controlling the operations of the source drivers 30, 31, sense amplifier 32 and programming buffer 33.

Figure 1A:
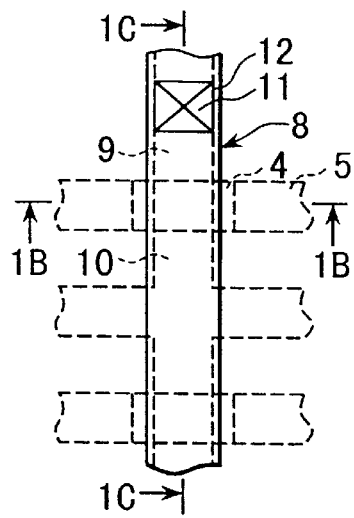
FIG. 1A is a pattern plan view for illustrating an example of the construction of a memory cell in a conventional NOR type flash memory.
Figure 1B:
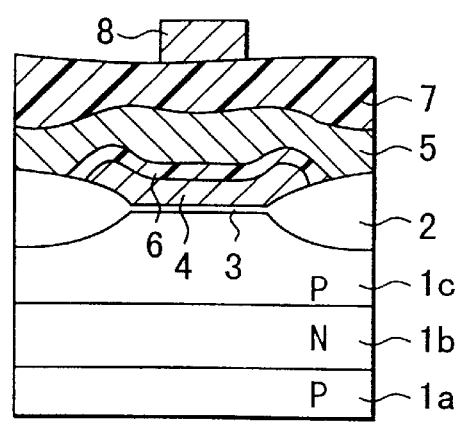
FIG. 1B is a cross sectional view taken along the line 1B—1B of the pattern shown in FIG. 1A.
Figure 1C:
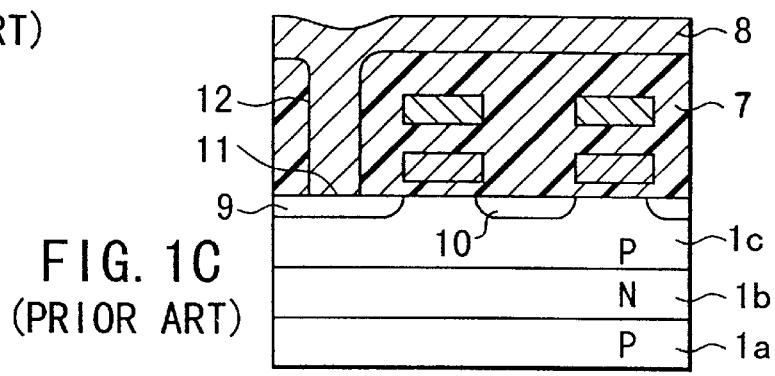
FIG. 1C is a cross sectional view taken along the line 1C—1C of the pattern shown in FIG. 1A.
Figure 2:
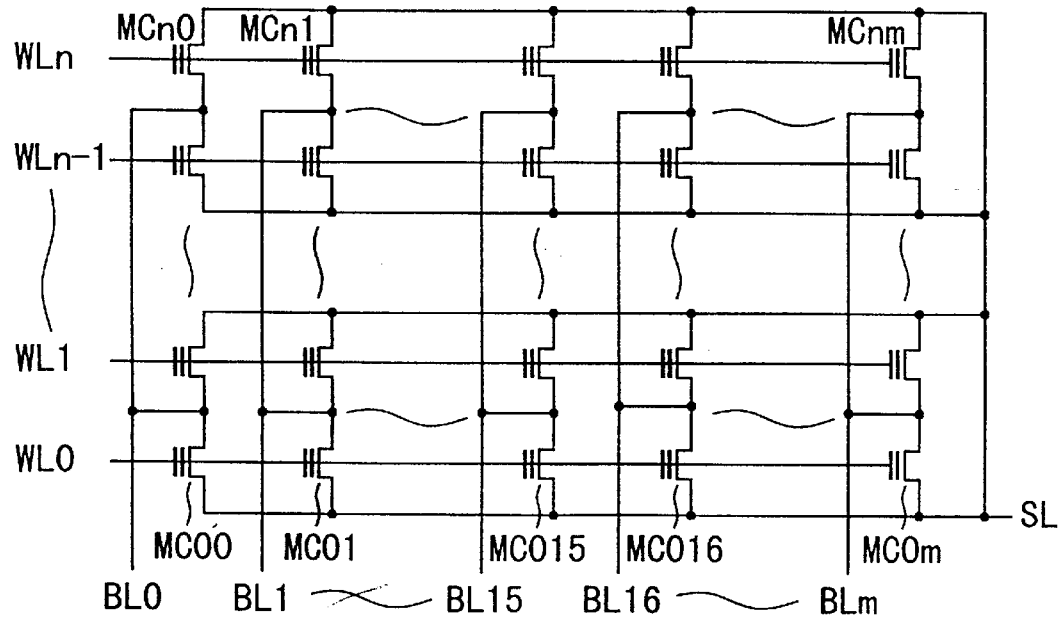
FIG. 2 is a circuit diagram showing an example of the construction of a memory cell array in which memory cells having the same construction as the memory cell shown in FIG. 1A are arranged in a matrix form.

A cell array block (one) in the memory cell array 21 or 22 has the same basic construction as the circuit shown in FIG. 2. There is provided a cell selection circuit (word line selection circuit, column selection circuit) for selecting one of a plurality of word lines in the same cell array block and simultaneously selecting one bit line in each of a plurality of groups among a plurality of bit lines at the time of data programming.

Figure 3:
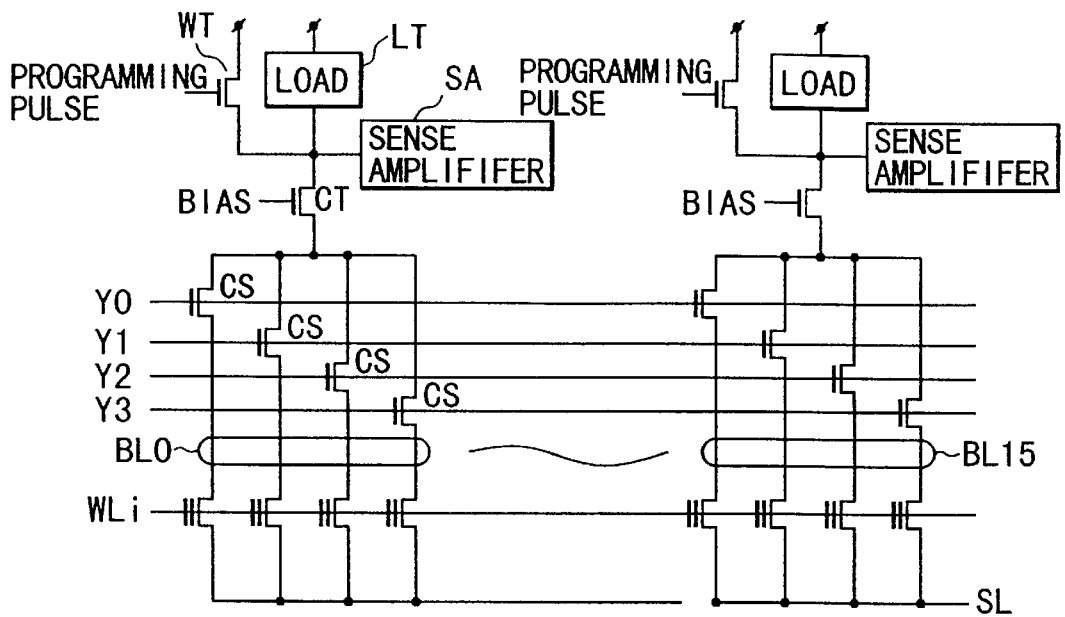
FIG. 3 is a circuit diagram showing part of a cell array block in the conventional NOR type flash memory of plural-bit configuration and part of a peripheral circuit associated therewith.

Further, as shown in FIG. 3, a readout bit potential clamping transistor CT, load transistor LT, programming transistor WT and sense amplifier SA are connected to bit lines of each of a plurality of groups in the cell array block (that is, a common bit line to which a plurality of bit lines of each group are commonly connected).

FIGS. 11A to 11D and FIGS. 12A to 12C respectively show an example of the construction of the signal generating circuit 37 for generating various signals shown in FIG. 10. The signal generating circuit 37 includes a PGM generation circuit, ø1 generation circuit, ø5 generation circuit, binary counter circuit, logic circuit and the like.

Figure 11A:
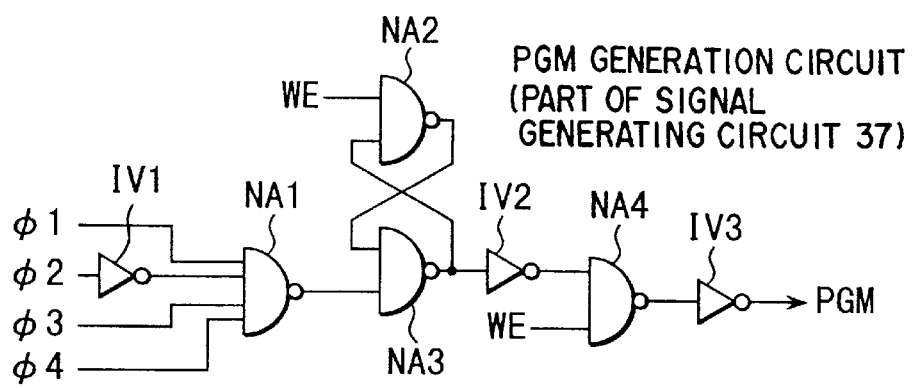
FIGS. 11A to 11D are circuit diagrams showing an example of the construction of part of a signal generating circuit shown in FIG. 10.

The PGM generation circuit shown in FIG. 11A includes NAND gates NA1 to NA4 and inverters IV1 to IV3. The PGM generation circuit generates an enable control signal PGM of pulse width 26 $\mu$s based on the clock signals ø1 to ø4 and programming signal WE.

Figure 11B:
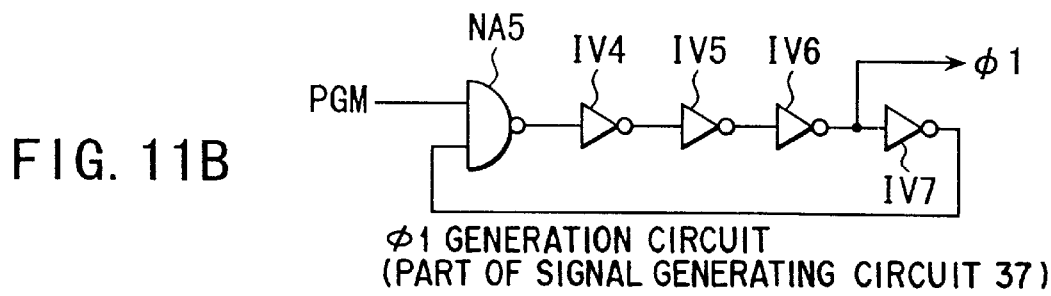

The ø1 generation circuit shown in FIG. 11B includes a NAND gate NA5 and inverters IV4 to IV7. The ø1 generation circuit generates a clock signal ø1 of pulse width 2 µs based on the enable control signal PGM.

Figure 11C:
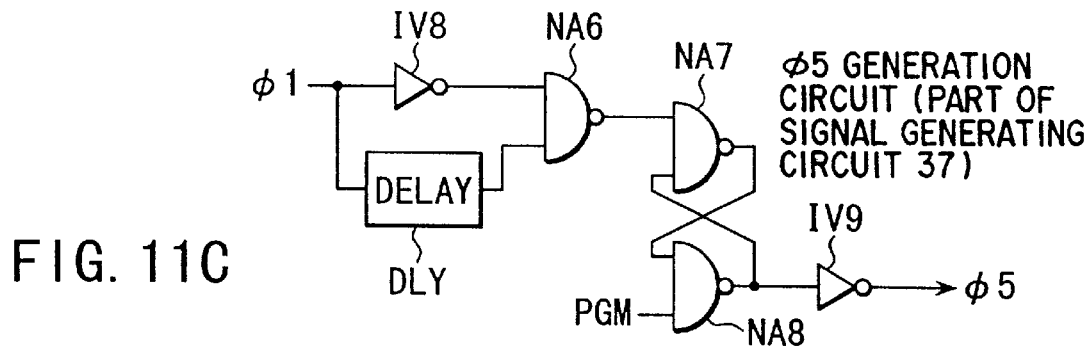

The ø5 generation circuit shown in FIG. 11C includes NAND gates NA6 to NA8, delay gate DLY and inverters IV8, IV9. The ø5 generation circuit generates a clock signal ø5 of pulse width 24 µs based on the clock signal ø1 and enable control signal PGM.

Figure 11D:
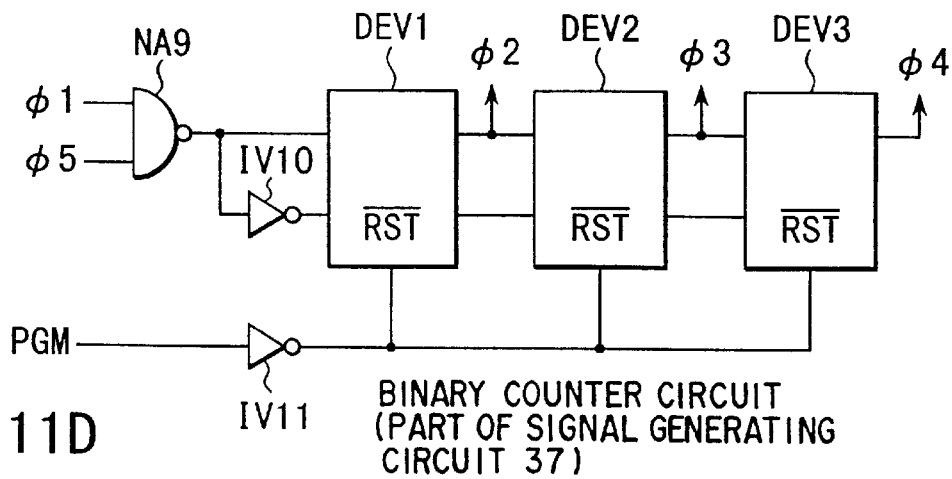

The binary counter circuit shown in FIG. 11D includes 3-stage cascade-connected frequency dividing circuits DEV1 to DEV3, NAND gate NA9 and inverters IV10, IV11. Each of the frequency dividing circuits DEV1 to DEV3 is reset by an inverted signal of the enable control signal PGM to frequency-divide the complementary signal of a NAND signal of the clock signals ø1 and ø5 so as to derive a clock signal ø2 of pulse width 4 µs from the first-stage frequency dividing circuit DEV1, a clock signal ø3 of pulse width 8 µs from the next-stage frequency dividing circuit DEV2 and a clock signal ø4 from the final-stage frequency dividing circuit DEV3.

The logic circuit shown in FIG. 12A includes NAND gates NA10 to NA12 and inverters IV12, IV13 and generates a programming control pulse signal ø6 based on the signals ø1, ø3 to ø5.

The logic circuit shown in FIG. 12B includes NOR gates NR1 to NR3 and inverters IV14 to IV16 and generates a programming control pulse signal ø7 based on the signals ø1 to ø5.

The logic circuit shown in FIG. 12C includes NAND gates NA13 to NA16, NOR gate NR4 and inverters IV17 to IV21 and generates programming control pulse signals ø8, ø9 based on the signals ø1 to ø4.

Figure 13:
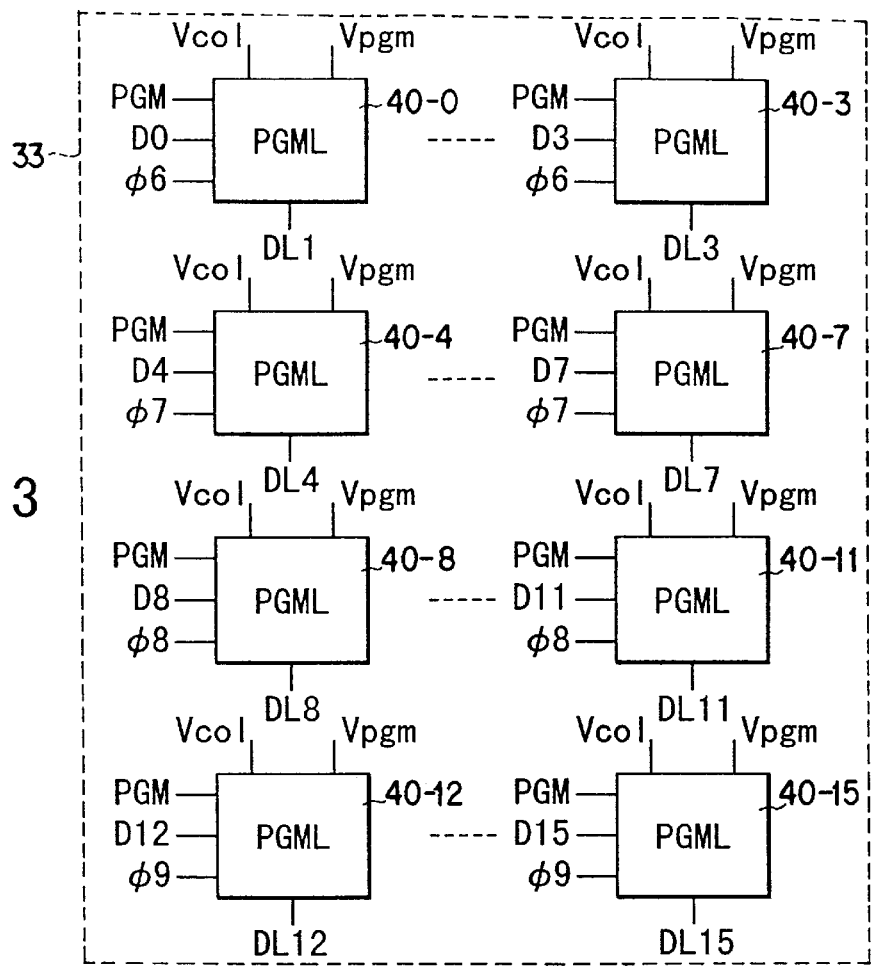
FIG. 13 is a circuit diagram showing an example of the construction of a programming load of the circuit shown in FIG. 10.

FIG. 13 shows an example of the construction of the programming load 33 in the circuit shown in FIG. 10. The programming load 33 includes 16 block circuits 40-0 to 40-15. Each of the block circuits 40-0 to 40-15 is supplied with the output signal PGM of the PGM generation circuit shown in FIG. 11A, a power supply voltage Vcol for switching the programming load and a program voltage Vpgm. Further, each of the block circuits 40-0 to 40-15 is supplied with data Din (D0 to D15). The block circuits 40-0 to 40-3 are supplied with the programming control pulse signal ø6, the block circuits 40-4 to 40-7 are supplied with the programming control pulse signal ø7, the block circuits 40-8 to 40-11 are supplied with the programming control pulse signal ø8, and the block circuits 40-12 to 40-15 are supplied with the programming control pulse signal ø9. The block circuits 40-0 to 40-15 are respectively connected to data lines DL0 to DL15.

Figure 14:
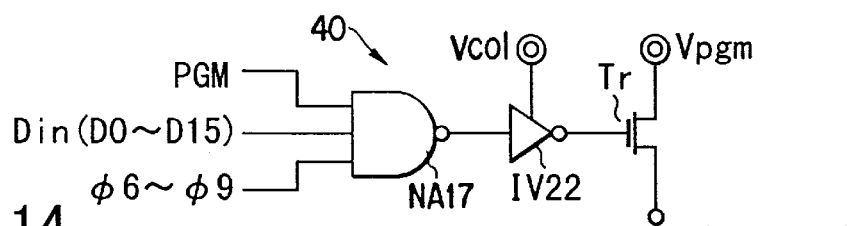
FIG. 14 is a circuit diagram showing an example of the construction of each block circuit of the circuit shown in FIG. 13.

FIG. 14 shows an example of the construction of each of the block circuits 40-0 to 40-15 in the circuit shown in FIG. 13. The circuit includes a NAND gate NA17, inverter IV22 and transistor Tr. The signal PGM is supplied to the first input terminal of the NAND gate NA17, data Din (D0 to D15) is supplied to the second input terminal thereof, and a corresponding one of the programming control pulse signals ø6 to ø9 is supplied to the third input terminal thereof. An output signal of the NAND gate NA17 is supplied to the input terminal of the inverter IV22. The inverter IV22 is supplied with the power supply voltage Vcol for switching the programming load as a power supply voltage. An output signal of the inverter IV22 is supplied to the gate of the transistor Tr. One end of the current path of the transistor Tr is supplied with the program voltage Vpgm and the other end thereof is connected to a corresponding one of the data lines DLi (i=0 to 15).

Figure 15:
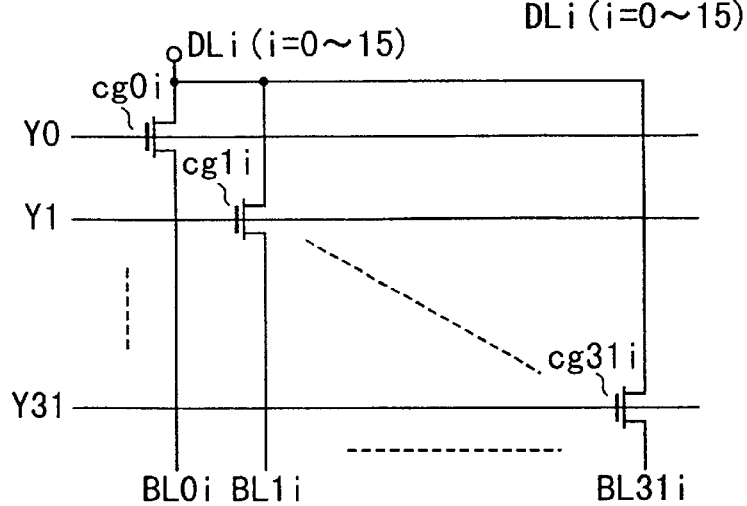
FIG. 15 is a circuit diagram showing an example of the construction of a column gate of the circuit shown in FIG. 10.

FIG. 15 is a circuit diagram showing an example of the construction of column gates in the circuit shown in FIG. 10.

The data line DLi is connected to a bit line on the column selected by signals Y0 to Y31 among the 32 column gates cg0i to cg31i. For example, if the signal Y0 is set to the "H" level, the potential of the bit lines BL00 to BL03 is set to a voltage which is synchronized with the signal ø6, the potential of the bit lines BL04 to BL07 is set to a voltage which is synchronized with the signal ø7, the potential of the bit lines BL08 to BL011 is set to a voltage which is synchronized with the signal ø8, and the potential of the bit lines BL012 to BL015 is set to a voltage which is synchronized with the signal ø9. Thus, since the number of bits is increased with the progress of programming, the programming time can be reduced.

Figure 16:
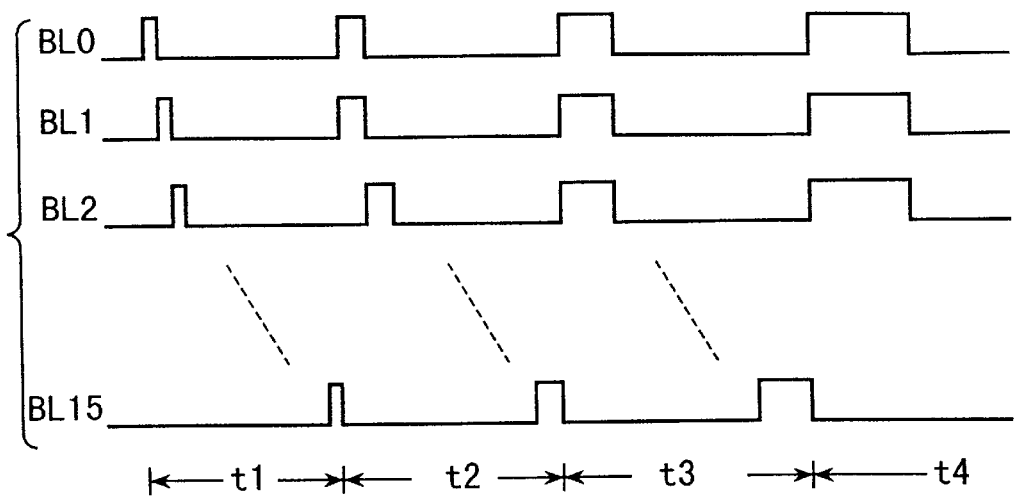
FIG. 16 is a timing chart showing a potential change of each bit line.

FIG. 16 is a timing chart showing a variation in the potential of each bit line in the circuit shown in FIG. 15. In this case, a variation in the bit line potential is shown which is caused when one bit is programmed in a period of time t1, two bits are simultaneously programmed in a period of time t2, four bits are simultaneously programmed in a period of time t3, eight bits are simultaneously programmed in a period of time t4, and 16 bits are simultaneously programmed in a period of time t5. The relation of the periods of time is set such that t1<t2<t3<t4<t5.

In the above explanation, the 16-bit input/output configuration is explained as an example, but this invention can be easily applied to the 8-bit input/output configuration or 32-bit input/output configuration.

Figure 17:
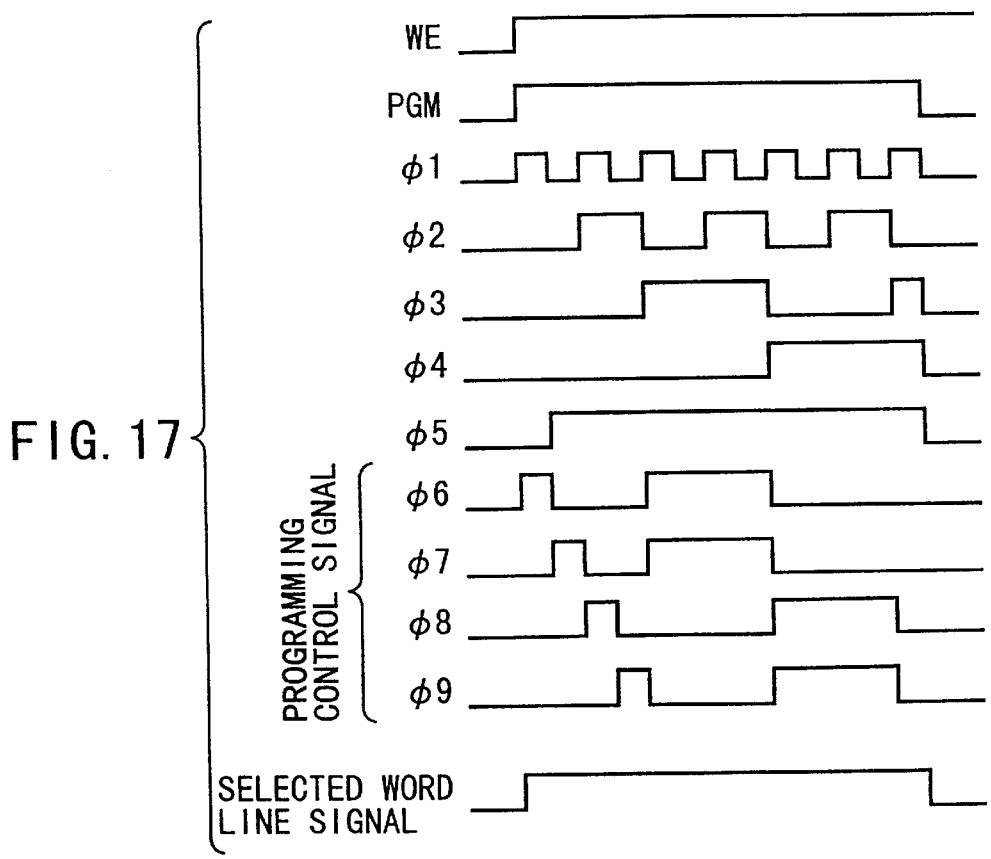
FIG. 17 is a timing chart showing various signals in the NOR type flash memory according to the first embodiment of this invention.

FIG. 17 is a timing chart showing various signals in the NOR type flash memory. In the programming operation of the NOR type flash memory, the memory cells are divided into four groups at the time of programming data of 16-bit width and data is first serially programmed in the unit of four bits in each first programming period (for example, a period of time in which the programming current of the memory cell is reduced to approximately half the initial value 450 µA, in this example, 2 µs). After this, data is serially programmed, for example, in the unit of eight bits which is twice the unit of four bits in each second programming period (a period of time in which the threshold voltage of the memory cell programmed for the first programming period reaches a preset value, in this example, 8 µs) which is longer than the first programming period.

In this case, if the booster circuit in which the supply current is set to 1.8 mA is used to reduce the area of the programming voltage booster circuit and the consumption current, the total programming time is 1.8 mA/450 µA×2 µs+1.8 mA/225 µA×8 µs=24 µs.

Figure 6:
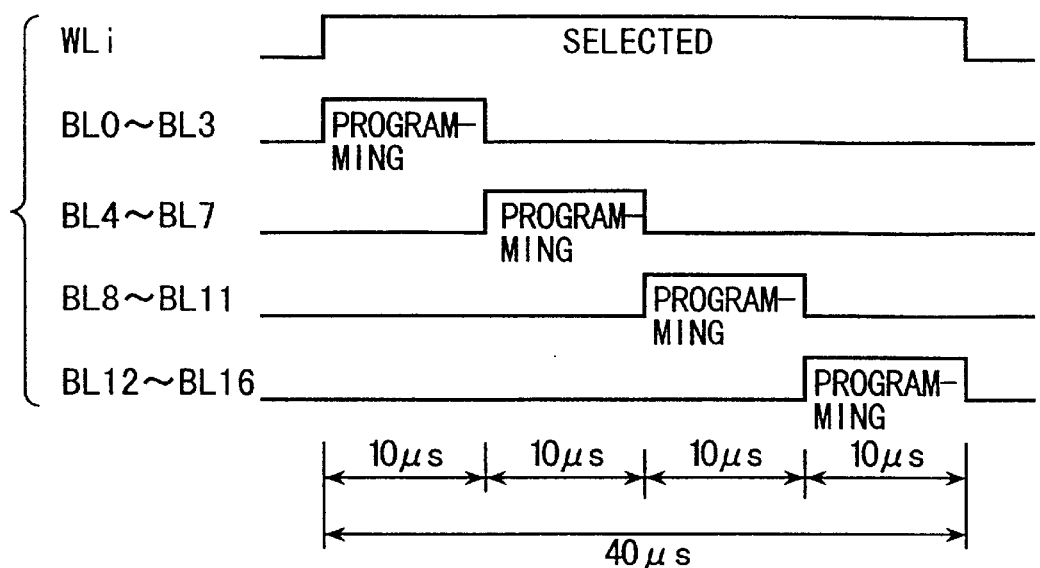
FIG. 6 is a timing chart showing one example of programming signal waveforms for illustrating the conventional method for reducing the area of the programming voltage booster circuit and the consumption current.

On the other hand, if the programming bits are divided in the unit of four bits and data is programmed in a simply time-divided fashion according to the programming method explained with reference to FIG. 6, the total programming time is 1.8 mA/450 µA×10 µs=40 µs.

That is, according to the NOR type flash memory with the above construction, the area of the programming voltage booster circuit and the consumption current can be reduced and the programming time can be significantly reduced.

In the case of actual programming operation, a programming signal used for driving the programming transistor WT in the circuit shown in FIG. 3 is generated by deriving the logical AND of the programming control pulse signals ø6 to ø9 shown in FIG. 17, a block selection signal for selectively specifying the programming block and programming data ("0" data or "1" data).

That is, according to the NOR type flash memory with the above construction, since the number of divisions of the programming bit number is reduced (the number of programming bits is increased) with the progress of programming, a limited current supplied from the programming voltage booster circuit can be efficiently distributed and the programming time can be reduced in comparison with the conventional memory in which the number of divisions is fixed.

By expanding and generally representing the content of the first embodiment, a nonvolatile semiconductor memory is obtained which includes a plurality of word lines, a plurality of bit lines, a source line, a plurality of nonvolatile memory cells each of which includes a gate electrode, drain electrode and source electrode and in each of which the gate electrode is connected to a corresponding one of the plurality of word lines, the drain electrode is connected to a corresponding one of the plurality of bit lines and the source electrode is connected to the source line, a cell selection circuit for selecting one of the plurality of word lines and simultaneously selecting one bit line from each of a plurality of groups among the plurality of bit lines at the time of data programming, a plurality of transistors respectively connected to the bit lines of the plurality of groups, and programming circuit for increasing the number of programming bits with the progress of programming when data of a plurality of bits is programmed into a plurality of memory cells which are simultaneously selected by the cell selection circuit.

Figure 7:
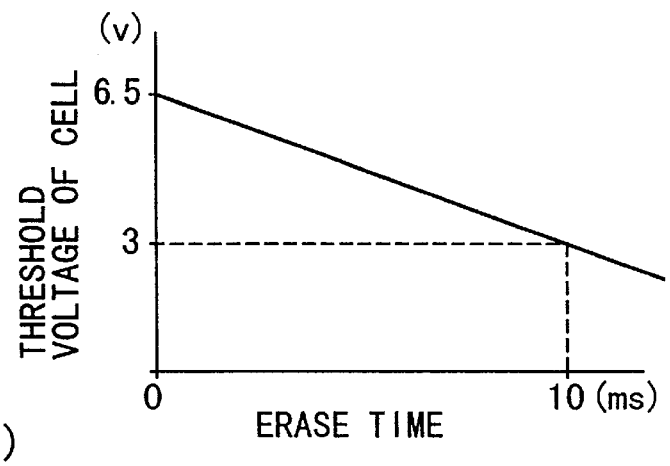
FIG. 7 is a characteristic diagram showing the characteristic of a change in the threshold voltage with erase time in a memory cell of the NOR type flash memory.

Next, the data erase operation in the NOR type flash memory is explained. In the characteristics shown in FIGS. 7 and 8, the initial value of a band-band tunnel current is 4 mA, and the band-band tunnel current is reduced with the progress of erasing. The band-band tunnel current after an elapse of 2 ms from the start of the erase operation is 1 mA and the threshold voltage after an elapse of 10 ms from the start of the erase operation is 3V ("1" data).

Figure 18:
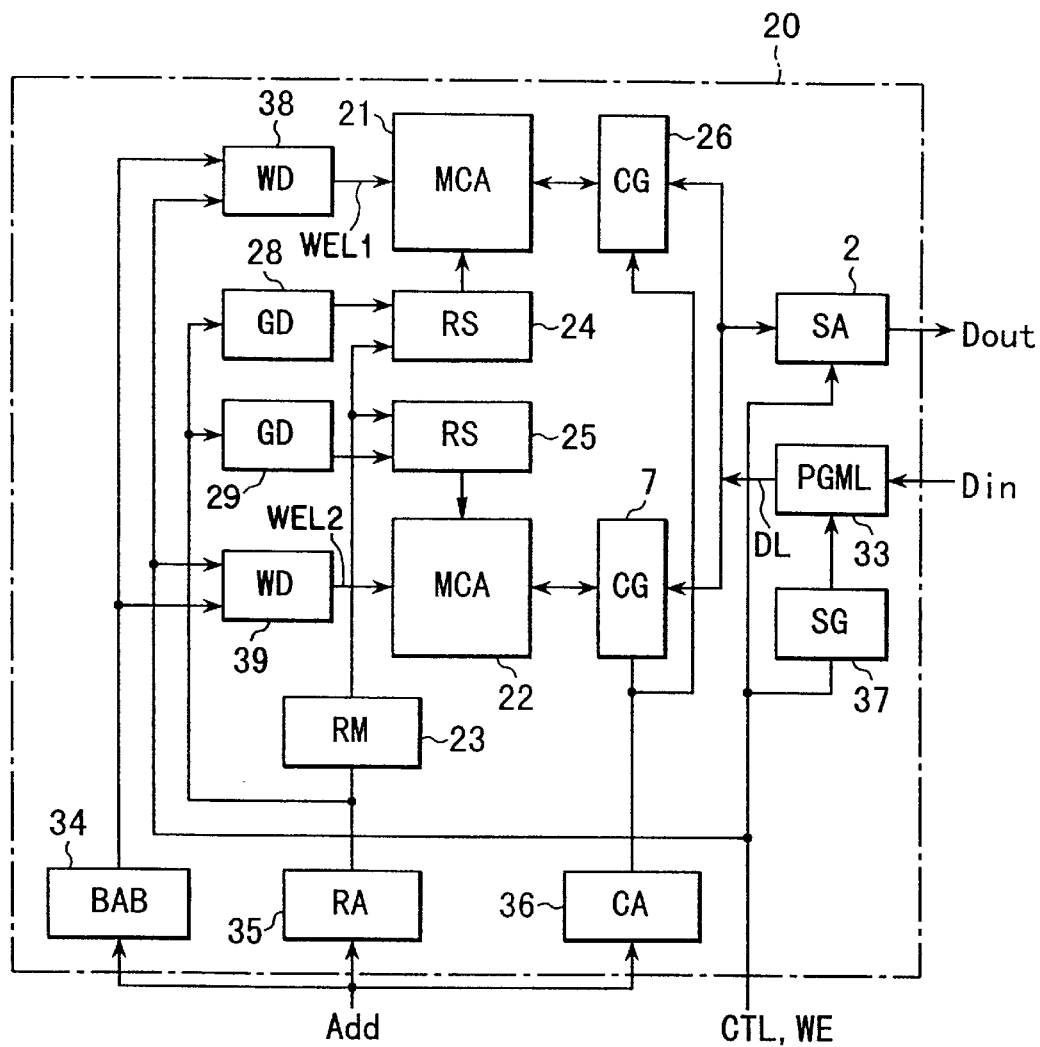
FIG. 18 is a block diagram showing a modification of the circuit shown in FIG. 10.

FIG. 18 shows a modification of the circuit shown in FIG. 10. The circuit of FIG. 18 is different from the circuit of FIG. 10 in that well drivers (WD) 38, 39 are used instead of the source drivers (SD) 30, 31. The other construction is the same as that of the circuit shown in FIG. 10, portions which are the same as those of FIG. 10 are denoted by the same reference numerals and the detail explanation thereof is omitted.

Figure 19:
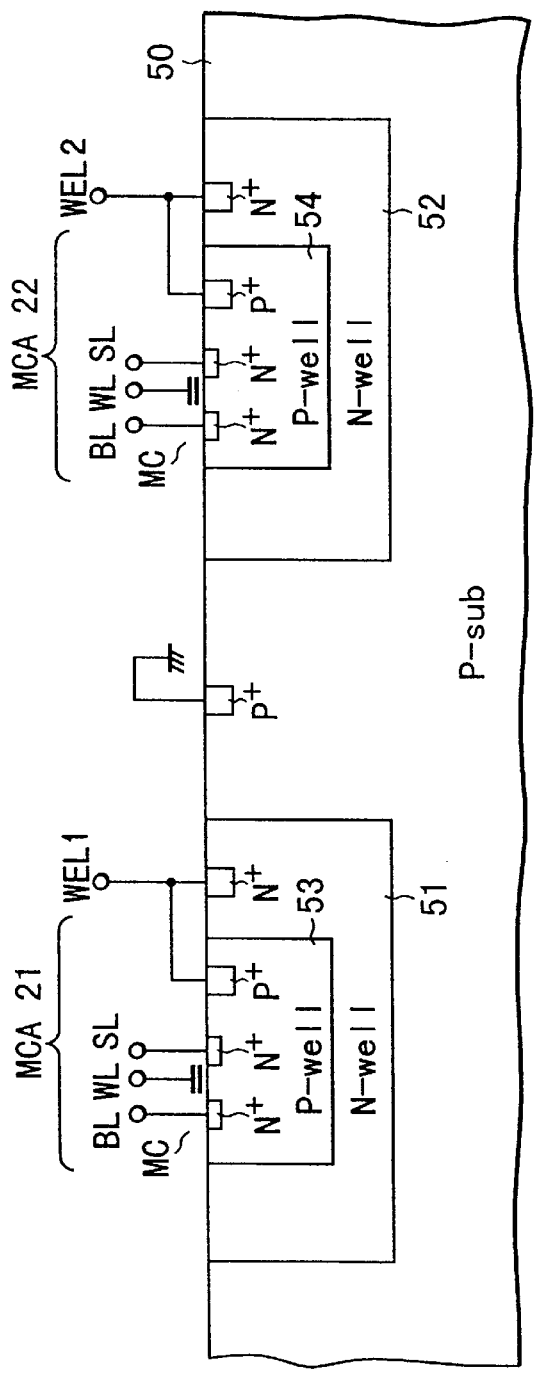
FIG. 19 is a cross sectional view showing the circuit shown in FIG. 18.

FIG. 19 is a cross sectional view of the circuit shown in FIG. 18. In this example, N-type wells 51, 52 for memory cell arrays MCA21, MCA22 are formed in a P-type semiconductor substrate 50 and P-type wells 53, 54 are formed in the wells 51, 52. The memory cell arrays MCA21, MCA22 are formed in the P-type wells 53, 54. The drain of each of memory cells MC in the memory cell arrays MCA21, MCA22 is connected to a bit line BL, the source thereof is connected to a source line SL and the control gate thereof is connected to a word line WL. The wells 51, 53 are driven by an output potential WEL1 of the well driver 38 and the wells 52, 54 are driven by an output potential WEL2 of the well driver 39.

With the above construction, the operation which is basically the same as that of the first embodiment can be effected and the same effect can be attained.

Figure 20:
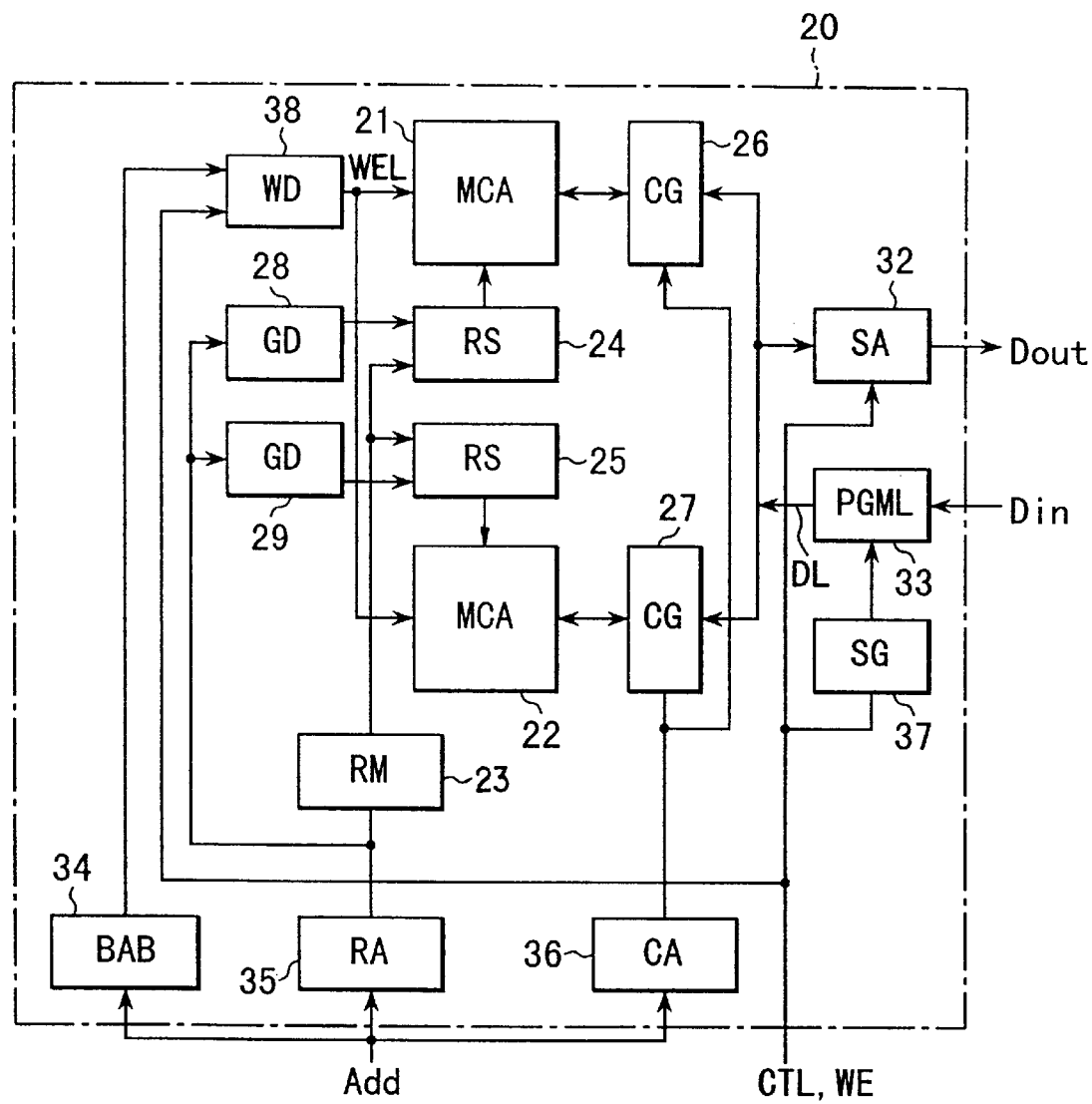
FIG. 20 is a block diagram showing another modification of the circuit shown in FIG. 10.

FIG. 20 shows another modification of the circuit shown in FIG. 10. The circuit of FIG. 20 is different from the circuit of FIG. 10 in that a well driver (WD) 38 is used instead of the source drivers (SD) 30, 31. The other construction is the same as that of the circuit shown in FIG. 10, portions which are the same as those of FIG. 10 are denoted by the same reference numerals and the detail explanation thereof is omitted.

Figure 21:
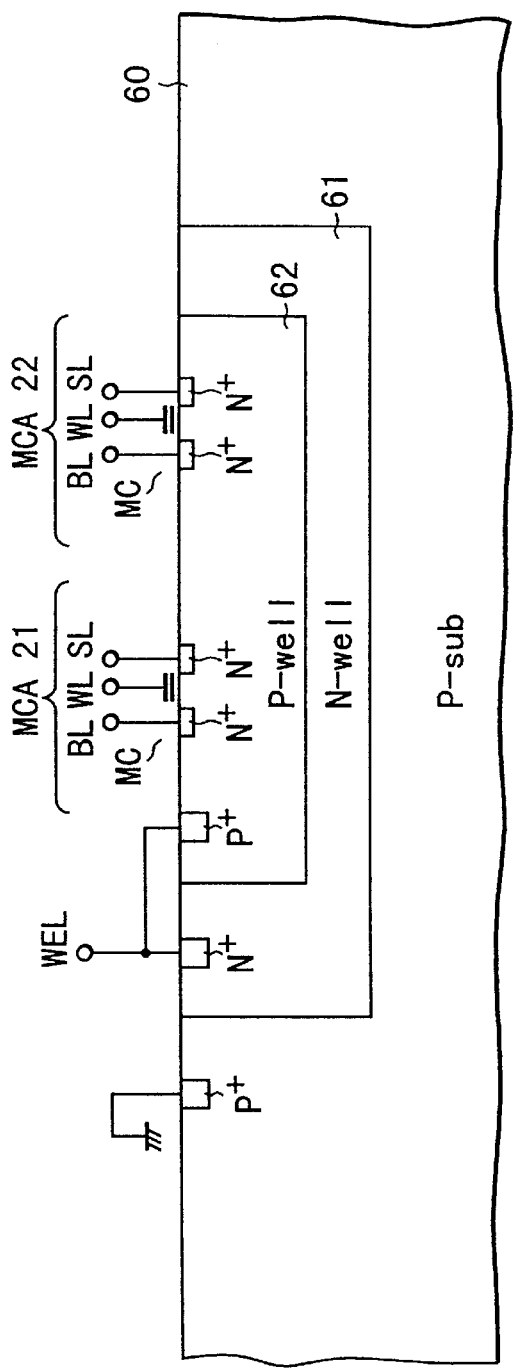
FIG. 21 is a cross sectional view showing the circuit shown in FIG. 20.

FIG. 21 is a cross sectional view of the circuit shown in FIG. 20. In this example, an N-type well 61 is formed in a P-type semiconductor substrate 60 and a P-type well 63 is formed in the well 61. The memory cell arrays MCA21, MCA22 are formed in the P-type well 63. The drain of each of memory cells MC in the memory cell arrays MCA21, MCA22 is connected to a bit line BL, the source thereof is connected to a source line SL and the control gate thereof is connected to a word line WL. The wells 61, 62 are driven by an output potential WEL of the well driver 38.

With the above construction, the operation which is basically the same as those of the first embodiment and the modification shown in FIGS. 18 and 19 can be effected and the same effect can be attained.

(Second Embodiment)

The data erase operation described below is to reduce the area of the erase voltage booster circuit and the consumption current by reducing the number of bits to be erased or reducing the number of erase bits immediately after the start of the erase operation and then increasing the number of erase bits with the progress of erasing in comparison with the conventional method in which the number of erase bits is fixed at 512 kbits.

The above control operation can be realized by simultaneously setting a plurality of row address pre-decode signals into the selected state so as to simultaneously set the row decoder blocks into the selected state.

That is, in the second embodiment, the area required for the erase voltage booster circuit is reduced by dividing the row decoder and a plurality of word lines into N ($\geq 2$) groups, serially selecting the groups to subject them to the erase operation and thus dispersing the peak portions of the erase current when the erase operation is effected for data of the cell array block MCA having a bit capacity of 512 kbits (64 kbytes).

FIG. 22 shows an example of the construction of one cell array block MCA commonly using one source line and a row decoder array corresponding thereto in the NOR type flash memory, for illustrating a nonvolatile semiconductor memory according to the second embodiment of this invention.

The cell array block MCA in FIG. 22 includes i×j memory cells, i bit lines BL0 to BL(i−1), j word lines WL0 to WL(j−1) and one source line SL. In this case, i=1024 and j=512, that is, the cell array block MCA is formed of a configuration of 512 word lines×1 kbit lines and constructed by eight sub-cell array blocks MCAB0 to MCAB7 each having the bit capacity of 8 kbytes. The sub-cell array blocks MCAB0 to MCAB7 commonly have 1024 bit lines BL to BL(i−1) and one source line SL. The row decoder array RDA includes eight row decoder blocks RDB0 to RDB7 respectively provided for the eight sub-cell array blocks MCAB0 to MCAB7. Each of the row decoder blocks RDB0 to RDB7 includes eight row decoders RD and the row decoder array includes 64 row decoders RD in total. Each row decoder RD decodes the pre-decode signals GAm, GBn, VCGl (m=0 to 7, n=0 to 7, l=0 to 7).

Figure 23:
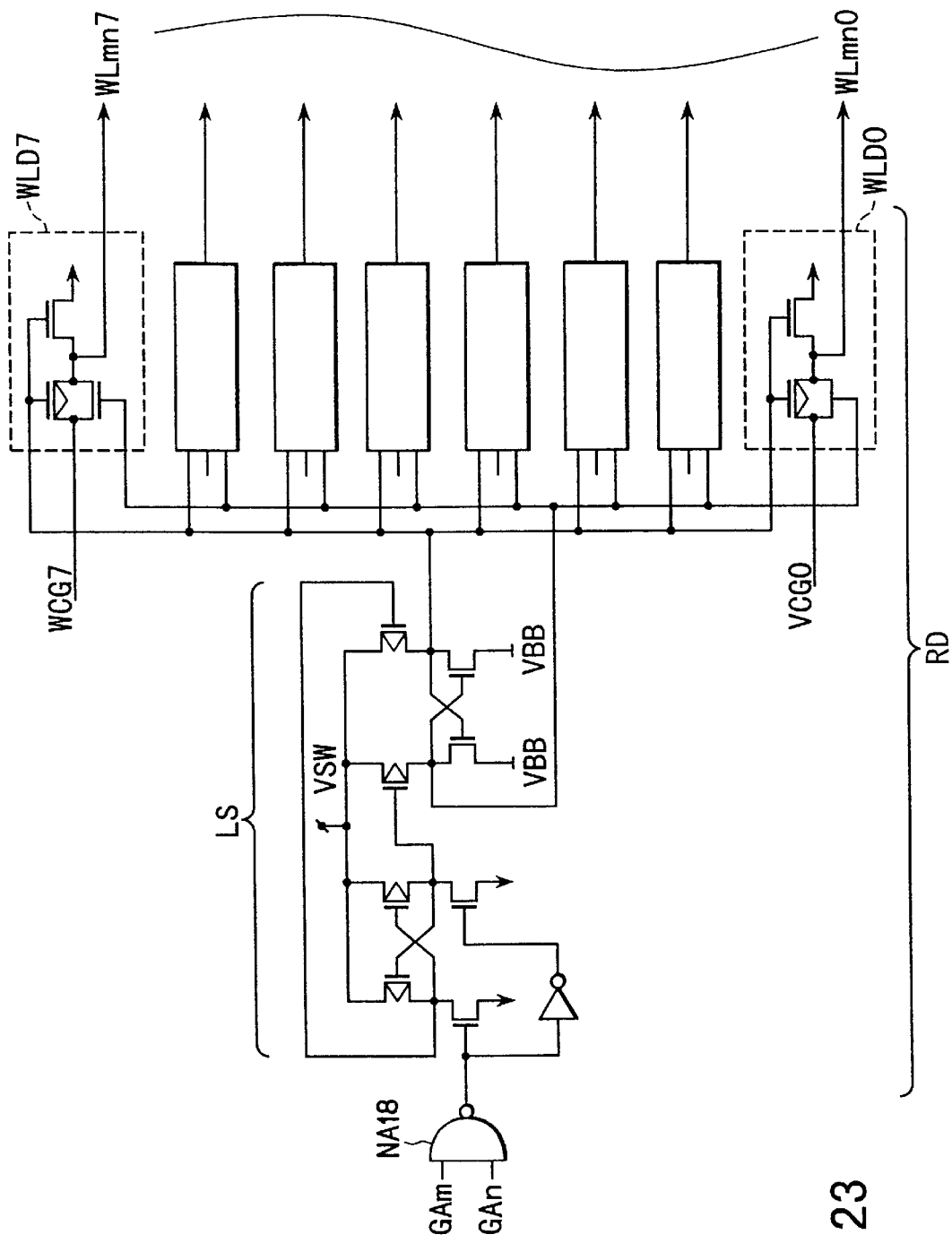
FIG. 23 is a circuit diagram showing an example of the construction of one of row decoders constructing the row decoder block in the circuit shown in FIG. 22.

FIG. 23 typically shows one of the row decoders RD of FIG. 22 in detail. The row decoder RD includes a NAND gate NA supplied with the pre-decode signals GAm, GBn, a level shifter LS supplied with the output signal of the NAND gate NA and eight word line drivers WLD0 to WLD7 supplied with the output signals of the level shifter LS. The signal VCGl (l=0 to 7) is supplied as a word line driver voltage.

In the row decoder RD, a first-stage NMOS input-type CMOS differential circuit is connected between a VSW node (for example, VSW=3V) and a ground node. A next-stage PMOS input-type CMOS differential circuit is connected between the VSW node and a VBB node (VBB is a negative voltage of −7.5V). The word line drivers WLD0 to WLD7 are each connected between the word line driver voltage source (VCGl) and the ground node.

In the row decoder RD with the above construction, driving signals for the eight word lines WLmnl (l=0 to 7) are created based on the pre-decode signals GAm, GBn, VCGl and driving signals for 512 word lines WLmnl in total in the row decoder array can be selectively generated according to the combination of m, n and l.

In this case, VBB is applied as the word line driver voltage source signal VCGl as will be described later at the time of erase and the output potentials of the row decoders RD in the selected row decoder block selected by the pre-decode signals GAm, GBn are set to VBB. On the other hand, the output potentials of the row decoders RD in the non-selected row decoder block are set to 0V.

Figure 24A:
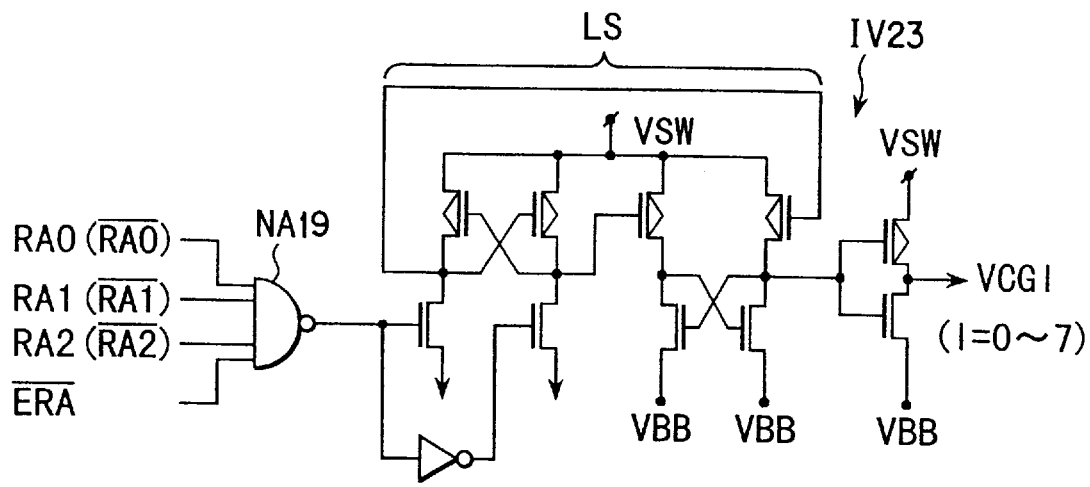
FIG. 24A is a circuit diagram showing an example of the construction of a VCG1 pre-decoder circuit for supplying a pre-decode signal to the row decoder of FIG. 23.

FIG. 24A shows an example of the construction of a VCGl pre-decoder circuit for creating the pre-decode signal VCGl in the circuit shown in FIG. 23.

The VCGl pre-decoder circuit includes a NAND gate NA19, level shifter LS and CMOS inverter (driver) IV23. The NAND gate NA19 is supplied with RA0 to RA2, $\overline{RA0}$ to $\overline{RA2}$ which are part of the complementary internal row address signals RA0 to RA8, $\overline{RA0}$ to $\overline{RA8}$ and an erase mode signal $\overline{ERA}$. The level shifter LS is supplied with the output signal of the NAND gate NA19. Further, the CMOS inverter (driver) IV23 is supplied with the output signal of the level shifter LS.

In the VCGl pre-decoder circuit, the level shifter LS has the same construction as that of the level shifter LS in the circuit shown in FIG. 23 and the CMOS inverter IV23 is connected between the VSW node and the VBB node.

The VCGl pre-decoder circuit with the above construction decodes the signals RA0 to RA2, $\overline{RA0}$ to $\overline{RA2}$ and outputs the pre-decode signal VCGl when the erase mode signal $\overline{ERA}$ is set in the disabled state (at the "H" level). On the other hand, if the erase mode signal $\overline{ERA}$ is set in the enabled state (at the "L" level), VBB is output as the pre-decode signal VCGl.

Figure 24B:
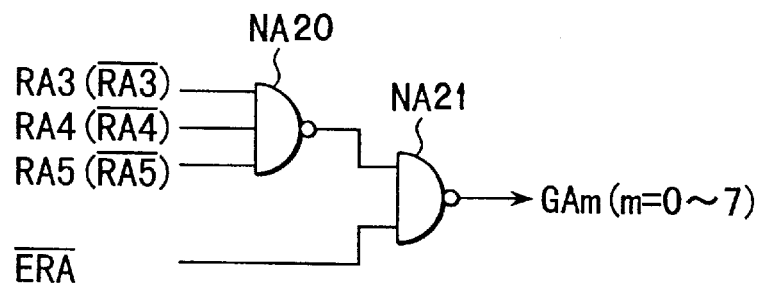
FIG. 24B is a circuit diagram showing an example of the construction of a GAm pre-decoder circuit for supplying a pre-decode signal to the row decoder of FIG. 23.

FIG. 24B shows an example of the construction of a GAm pre-decoder circuit for creating the pre-decode signal GAm in the circuit shown in FIG. 23. The GAm pre-decoder circuit includes NAND gates NA20, NA21. The NAND gate NA20 is supplied with the complementary internal row address signals RA3 to RA5, $\overline{RA3}$ to $\overline{RA5}$. The NAND gate NA21 is supplied with an output signal of the NAND gate NA20 and an erase mode signal $\overline{ERA}$.

The GAm pre-decoder circuit decodes the signals RA3 to RA5, $\overline{RA3}$ to $\overline{RA5}$ and outputs the pre-decode signal GAm when the erase mode signal $\overline{ERA}$ is set in the disabled state (at the "H" level) (at the time of readout/programming). On the other hand, if the erase mode signal $\overline{ERA}$ is set in the enabled state (at the "L" level), the "H" level is output as the pre-decode signal GAm.

Figure 24C:
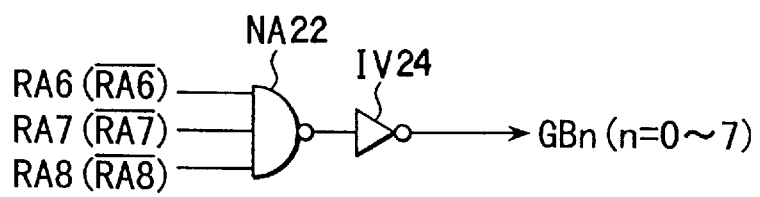
FIG. 24C is a circuit diagram showing an example of the construction of a GBn pre-decoder circuit for supplying a pre-decode signal to the row decoder of FIG. 23.

FIG. 24C shows an example of the construction of a GBn pre-decoder circuit for creating the pre-decode signal GBn in the circuit shown in FIG. 23. The GBn pre-decoder circuit includes a NAND gate NA22 and inverter IV24. The NAND gate NA22 is supplied with the complementary internal row address signals RA6 to RA8, $\overline{RA6}$ to $\overline{RA8}$ and the output signal of the NAND gate NA22 is supplied to the inverter IV24.

The GBn pre-decoder circuit decodes the signals RA6 to RA8, $\overline{RA6}$ to $\overline{RA8}$ and outputs the pre-decode signal GBn.

In this case, at the time of erase, 3-bit binary signals generated from a binary counter circuit in the chip are supplied as the signals RA6 to RA8, $\overline{RA6}$ to $\overline{RA8}$ as will be described later. Thus, the pre-decode signal GBn has a function as a row decoder block selection signal for selecting one of the eight row decoder blocks RDB0 to RDB7.

Figure 25A:
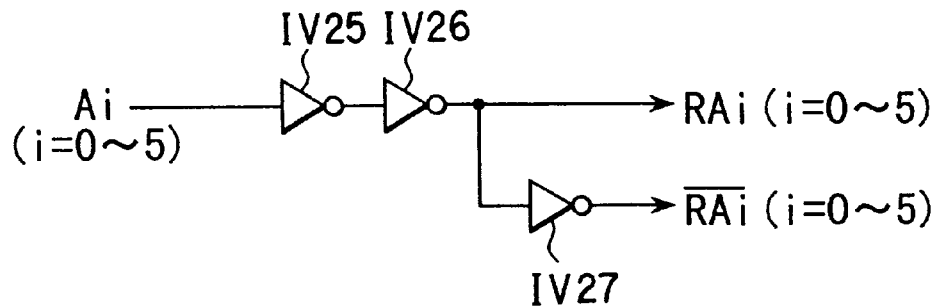
FIG. 25A is a circuit diagram typically showing one circuit for generating an internal row address signal in FIGS. 24A and 24B.

FIG. 25A typically shows one of the circuits for generating the internal row address signals RA0 to RA5, $\overline{RA0}$ to $\overline{RA5}$ in the circuits shown in FIGS. 24A and 24B. In the circuit, an address signal Ai (i=0 to 5) is supplied via 2-stage inverters IV25, IV26 to create a signal RAi (i=0 to 5) and the signal RAi is inverted by an inverter IV27 to create a signal $\overline{RAi}$ (i=0 to 5).

Figure 25B:
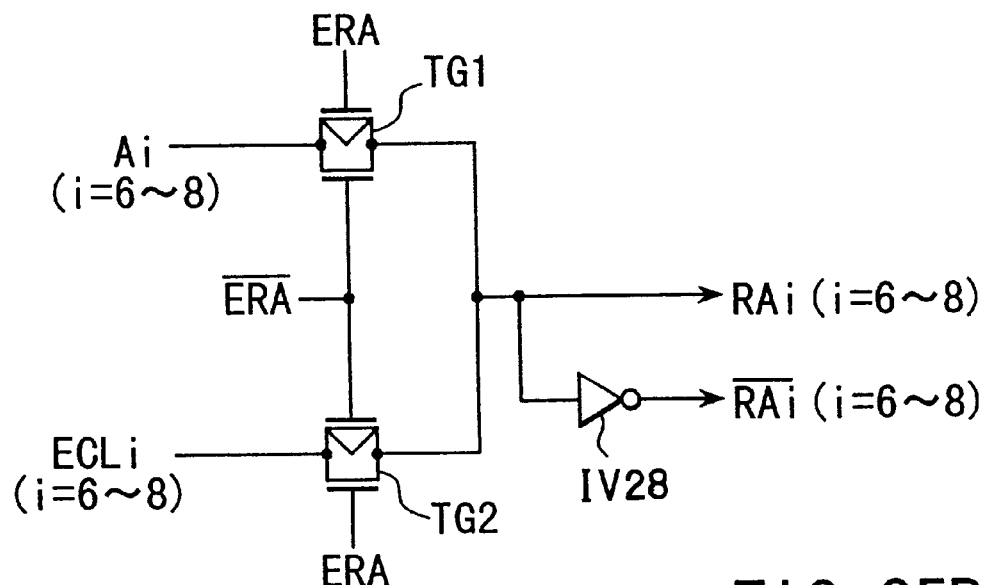
FIG. 25B is a circuit diagram typically showing one circuit for generating an internal row address signal in FIG. 24C.

FIG. 25B typically shows one of the circuits for generating the internal row address signals RA6 to RA8, $\overline{RA6}$ to $\overline{RA8}$ in the circuits shown in FIG. 24C. The circuit includes CMOS transfer gates TG1, TG2 and inverter IV28. An address signal Ai (i=6, 7, 8) is input to one end of the current path of the CMOS transfer gate TG1. A clock signal ECLKi (i=6, 7, 8) is input to one end of the current path of the CMOS transfer gate TG2. The input terminal of the inverter IV28 is connected to the other ends of the current paths of the two transfer gates TG1, TG2. The two transfer gates TG1, TG2 are switching-controlled in a complementary fashion by the complementary erase mode signals ERA, $\overline{ERA}$.

In the circuit, when the complementary erase mode signals ERA, $\overline{ERA}$ are set in the disabled state (at the time of readout/programming), the transfer gate TG1 is turned ON and the signal Ai and the inverted signal thereof are output as the signals RAi, $\overline{RAi}$.

On the other hand, when the complementary erase mode signals ERA, $\overline{ERA}$ are set in the enabled state, the other transfer gate TG2 is turned ON and the clock signal ECLKi and the inverted signal thereof are output as the signals RAi, $\overline{RAi}$.

Figure 25C:
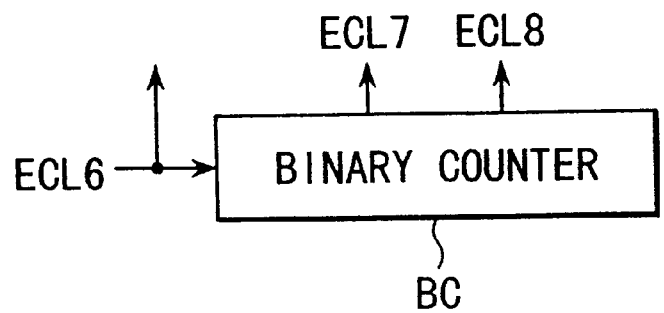
FIG. 25C is a circuit diagram showing a binary counter for supplying a clock signal in FIG. 25B.

FIG. 25C shows an example of the construction of the binary counter BC for supplying the clock signal ECLKi i=6, 7, 8) in the circuit shown in FIG. 25B. The binary counter BC divides the frequency of the clock signal ECLK6 to create clock signals ECLK7, ECLK8.

Figure 26:
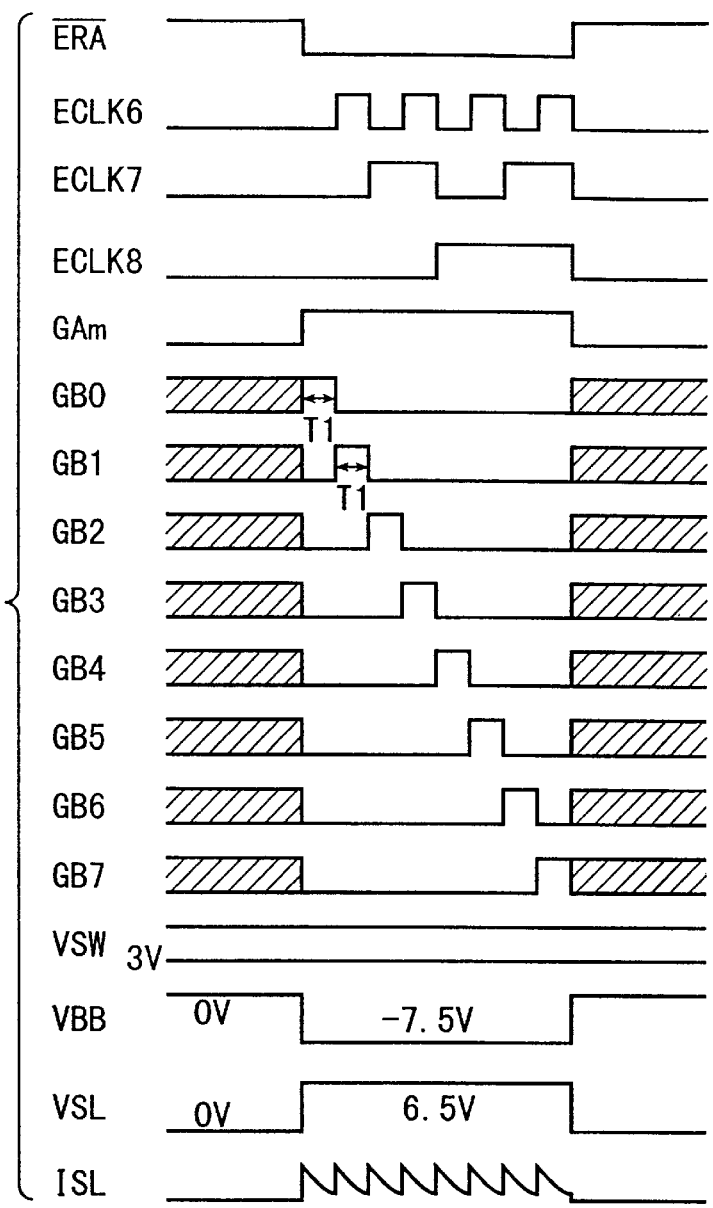
FIG. 26 is a timing chart for illustrating the erase operation of a cell array block MCA in the NOR type flash memory according to the second embodiment of this invention shown in FIG. 22.

FIG. 26 is a timing chart for illustrating the erase operation of the cell array block MCA in the NOR type flash memory shown in FIG. 22.

When the operation is set in to the erase mode, the GAm pre-decoder circuit shown in FIG. 24B outputs the "H" level as the pre-decode signal GAm. The GBn pre-decoder circuit shown in FIG. 24C outputs the signal GBn (which is a scanning signal selectively set at the "H" level) obtained by pre-decoding 3-bit binary signals supplied as the signals RA6 to RA8, $\overline{RA6}$ to $\overline{RA8}$. Thus, one of the eight row decoder blocks RDB0 to RDB7 is serially selected by use of the pre-decode signal GAm and the pre-decoded signal GBn.

Further, in the erase mode, since the VCGl pre-decoder circuit shown in FIG. 24A supplies VBB as the word line voltage source signal VCGl, the output of each row decoder RD in one selected row decoder block among the row decoder blocks RDB0 to RDB7 becomes VBB and the output of each row decoder RD in the remaining non-selected row decoder blocks is set to the non-selected potential (0V).

A source line voltage VSL supplied from the erase voltage booster circuit (not shown) is kept at 6.5V in a period from the start of the erase operation to the end thereof. As a result, data in the sub-cell array blocks MCAB0 to MCAB7 is serially erased.

That is, all of the word lines (first word line block) of the first sub-cell array block MCAB0 are set to −7.5V and all of the word lines of the other sub-cell array blocks MCAB1 to MCAB7 are set to 0V. The same operation is serially repeated for the word lines of the sub-cell array blocks up to the word lines (eighth word line block) of the eighth sub-cell array block MCAB7 and the erase operation is terminated.

Figure 8:
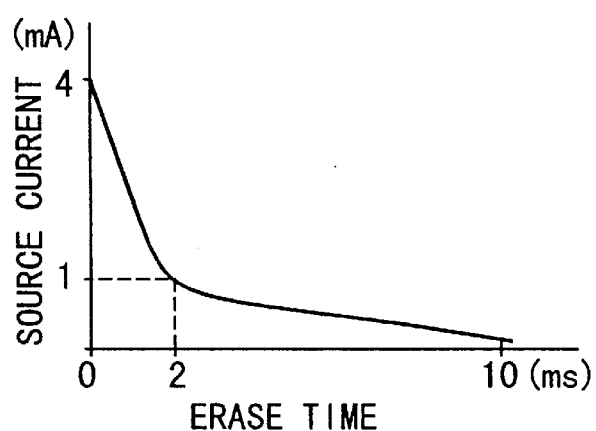
FIG. 8 is a characteristic diagram showing the characteristic of a change in the erase current (source current) with erase time in a memory cell of the NOR type flash memory.
Figure 9:
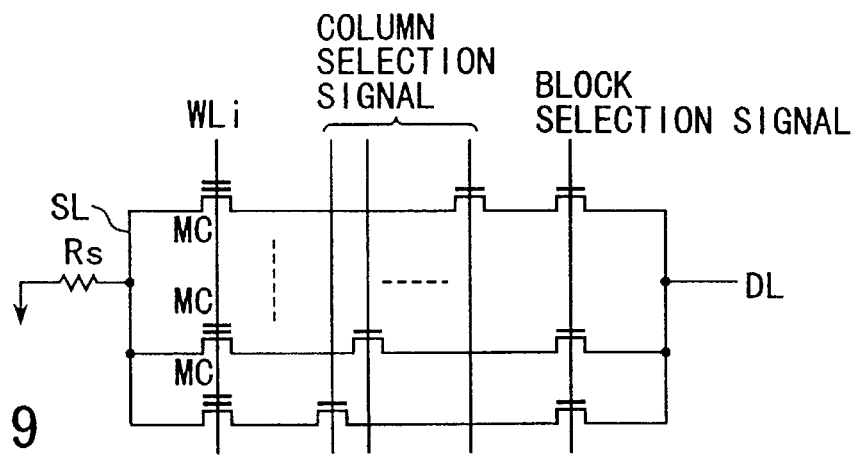
FIG. 9 is a circuit diagram schematically showing an example of the circuit construction of a cell array block in the conventional NOR type flash memory.

In this case, as is understood from the erase characteristic shown in FIG. 8, if the time T1 for setting one word line block to −7.5V is 10 ms, the total erase time becomes 80 ms (10 ms×8).

Further, since the waveform of the supply current ISL of the erase voltage booster circuit for biasing the source line SL can be dispersed into eight peaks corresponding to the serial erase operations for the eight sub-cell array blocks MCAB0 to MCAB7, the area required for the erase voltage booster circuit can be reduced.

By expanding and generally representing the content of the second embodiment, a nonvolatile semiconductor memory is obtained which includes erase circuit for respectively dividing a row decoder and a plurality of word lines into N ($\geq 2$) groups of first to Nth row decoder blocks and first to Nth word line blocks at the time of erasing of data of a 512-kbit cell array block and individually selecting the first to Nth word line blocks to time-divide a data erase operation into first to Nth erase operations and effect the data erase operation, wherein the erase circuit enables the selection logic for the pre-decode signal to set all of the row decoders in the selected row decoder block corresponding to the selected word line block selected from the first to Nth word line blocks into a selected state, sets the potentials of all of the word lines of the selected word line block to a first negative voltage with respect to the source line potential, enables the non-selection logic for the pre-decode signal to set all of the row decoders in the non-selected row decoder block other than the selected row decoder block into a non-selected state and sets the potentials of all of the word lines of the non-selected word line block other than the selected word line block to a second voltage having an absolute value smaller than the first negative voltage with respect to the source line potential.

(Third Embodiment)

A nonvolatile semiconductor memory according to a third embodiment of this invention is almost similar in construction to that of the second embodiment shown in FIGS. 22 to 26, but the sequence of application of signals in the erase operation is different.

Figure 27:
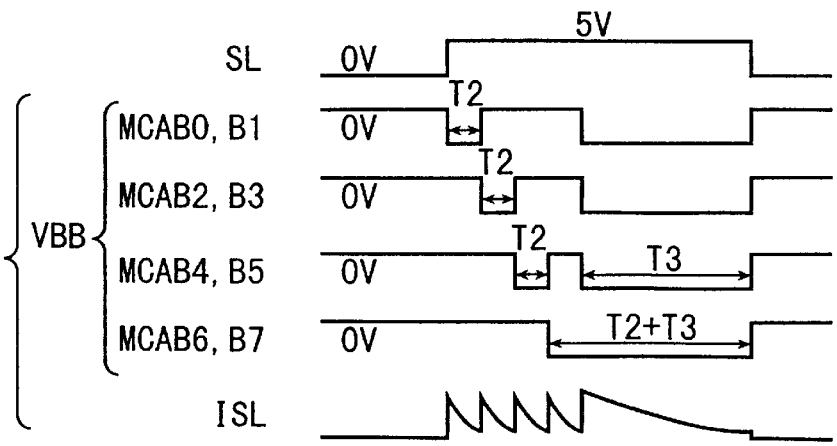
FIG. 27 is a timing chart showing the erase operation of a cell array block, for illustrating a nonvolatile semiconductor memory according to a third embodiment of this invention.

FIG. 27 is a timing chart showing the erase operation of a cell array block MCA, for illustrating the nonvolatile semiconductor memory according to the third embodiment of this invention. In the first half portion of the erase operation, sub-cell array blocks MCAB0 to MCAB7 are divided into four groups each including two blocks and the groups are serially selected according to the erase operation shown in FIG. 26. In this case, the time for setting the selected word line block to −10V is controlled to be set to T2 (for example, 2 ms) which is shorter than T1 (=10 ms) in FIG. 26.

After the serial selection proceeds to the word line block of the final group, the word line blocks of all of the groups are set into the selected state, that is, all of the word lines of the 512-kbit cell array are set to −10V. In this case, as is understood from the erase characteristic shown in FIG. 22, time T3 for setting all of the word lines to −10V may be 8 ms.

Therefore, the total erase time becomes 2 ms×4+8 ms=16 ms and can be significantly reduced in comparison with the total erase time 80 ms required for the erase operation shown in FIG. 26.

Further, since the waveform of the supply current ISL of the erase voltage booster circuit for biasing the source line can be dispersed into five peaks corresponding to the erase operations of the sub-cell array blocks of all of the groups and the serial erase operation of the sub-cell array blocks of each group, the area required for the erase voltage booster circuit can be reduced.

By expanding and generally representing the content of the third embodiment, a nonvolatile semiconductor memory is obtained which includes erase circuit for respectively dividing a row decoder and a plurality of word lines into N ($\geq 2$) groups of first to Nth row decoder blocks and first to Nth word line blocks at the time of erasing of data of a 512-kbit cell array block, individually selecting the first to Nth word line blocks to time-divide a data erase operation into first to Nth erase operations and effect the data erase operation and then simultaneously erasing data for all of the word line blocks, wherein the erase circuit enables the selection logic for the pre-decode signal to set all of the row decoders in the selected row decoder block corresponding to the selected word line block individually selected from the first to Nth word line blocks into a selected state, sets the potentials of all of the word lines of the selected word line block to a first negative voltage with respect to the source line potential, enables the non-selection logic for the pre-decode signal to set all of the row decoders in the non-selected row decoder block other than the selected row decoder block into a non-selected state and sets the potentials of all of the word lines of the non-selected word line block other than the selected word line block to a second voltage having an absolute value smaller than the first negative voltage with respect to the source line potential in a case where data of the selected word line block individually selected from the first to Nth word line blocks is erased, and enables the selection logic for the pre-decode signal to set all of the row decoders in all of the row decoder blocks into a selected state and sets the potentials of all of the word lines of all of the word line blocks to the first negative voltage with respect to the source line potential in a case where data is simultaneously erased for all of the word line blocks.

(Fourth Embodiment)

Figure 28:
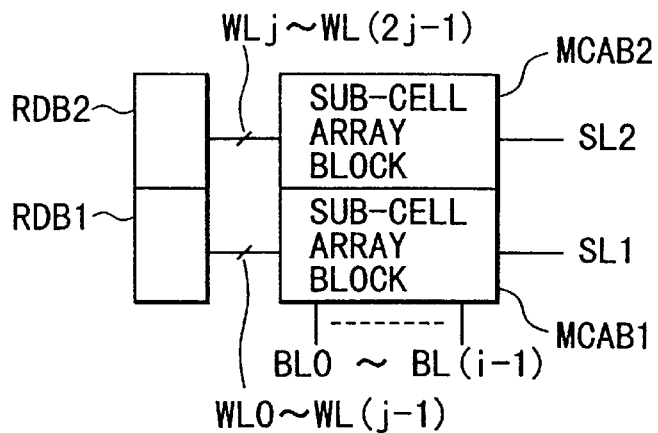
FIG. 28 is a circuit diagram showing a cell array block MCA in a NOR type flash memory and a row decoder array associated therewith, for illustrating a nonvolatile semiconductor memory according to a fourth embodiment of this invention.

FIG. 28 is a circuit diagram showing a cell array block MCA in a NOR type flash memory and a row decoder array associated therewith, for illustrating a nonvolatile semiconductor memory according to a fourth embodiment of this invention.

In the NOR type flash memory, the cell array block MCA having a bit capacity of 512 kbits (64 kbytes) is divided into two sub-cell array blocks MCAB1, MCAB2 each having a bit capacity of 32 kbytes.

Each of the sub-cell array blocks MCAB1, MCAB2 commonly uses 1024 bit lines BL0 to BL(i−1). The sub-cell array block MCAB1 has 256 word lines WL0 to WL(j−1) and one source line SL1 provided to extend in the word line direction. The sub-cell array block MCAB2 has 256 lines WLj to WL(2j−1) and one source line SL2 provided to extend in the word line direction.

The row decoder array is divided into two row decoder blocks RDB1, RDB2 corresponding to the two sub-cell array blocks MCAB1, MCAB2, each of the row decoder blocks RDB1, RDB2 has 32 row decoders RD and the row decoder array has 64 row decoders in total.

Figure 29:
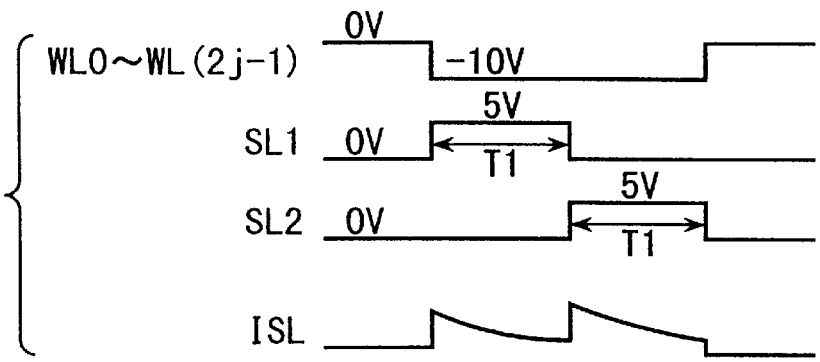
FIG. 29 is a timing chart for illustrating the erase operation of a cell array block in the circuit shown in FIG. 28.

FIG. 29 is a timing chart for illustrating the erase operation of the cell array block MCA in the circuit shown in FIG. 28. When the operation is set into the erase mode, the sub-cell array blocks MCAB1, MCAB2 are serially selected, a bias voltage (for example, 6.5V) is separately applied to the source lines SL1, SL2 in a period of time T1 (=10 ms) and a voltage of −10V is applied to all of the word lines in a period from the start of the erase operation to the end thereof. As a result, data of the sub-cell array blocks MCAB1, MCAB2 is serially erased.

Therefore, the total erase time required for the erase operation becomes 20 ms and the waveform of the supply current ISL of the erase voltage booster circuit for biasing the source lines SL1, SL2 can be dispersed into two peak portions. Thus, the erase voltage booster circuit having a maximum supply current of 2 mA can be used and the area required for the erase voltage booster circuit can be reduced.

Figure 30:
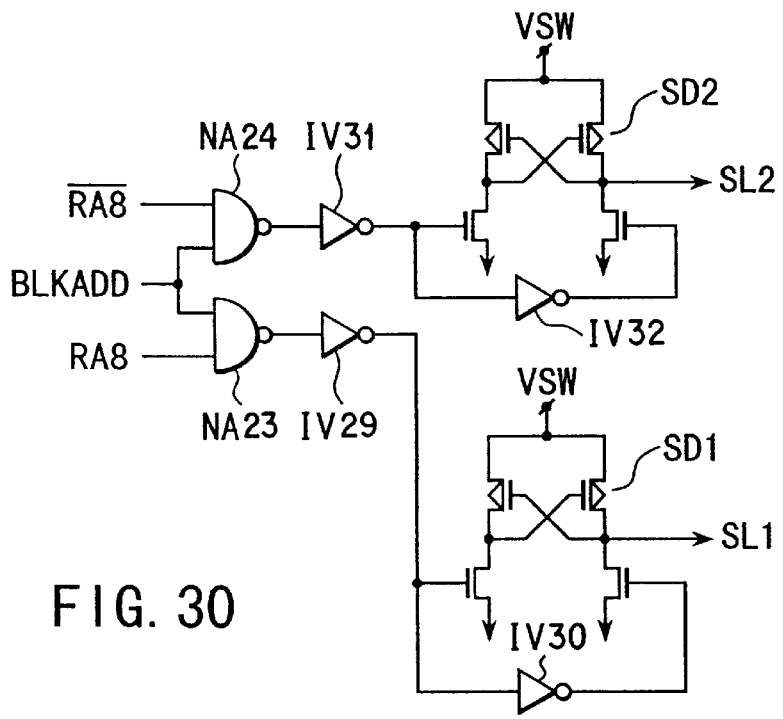
FIG. 30 is a circuit diagram showing an example of the construction of a source decoder for selecting two source lines in the circuit shown in FIG. 28.

FIG. 30 is a circuit diagram showing an example of the construction of a source decoder for selecting the two source lines SL1, SL2 in the circuit shown in FIG. 28.

Complementary internal row address signals RA8, $\overline{RA8}$ created from the most significant bit signal among the row address signal are respectively supplied to one-side input terminals of 2-input NAND gates NA23, NA24 and a block address signal BLKADD is supplied to the other input terminals of the NAND gates NA23, NA24.

The output signal of the NAND gate NA23 is inverted by inverters IV29, IV30 and then input to a source line driver SD1 as complementary signals. Further, the output signal of the NAND gate NA24 is inverted by inverters IV31, IV32 and then input to a source line driver SD2 as complementary signals. The source line drivers SD1, SD2 are each constructed by a CMOS latch circuit connected between a source line voltage VSW node and a Vss node.

The operation of the source decoder is described below. At the erase time, the block address signal BLKADD is set to the "H" level and one of the source lines SL1 and SL2 of the sub-cell array blocks MCAB1 and MCAB2 is set to the source line voltage VSW by the "H" level of one of the complementary internal row address signals RA8 and $\overline{RA8}$. The signals RA8, $\overline{RA8}$ are inverted in one erase operation and the source lines SL1, SL2 are serially selected and set to the source line voltage VSW.

At the non-selected time or during the operation other than the erase operation, the block address signal BLKADD is set at the "L" level and the potentials of the two source lines SL1, SL2 are set to 0V.

By expanding and generally representing the content of the fourth embodiment, a nonvolatile semiconductor memory is obtained which includes erase circuit for dividing a source line into first to Nth (≧2) source lines and respectively dividing a row decoder and a plurality of word lines into N groups of first to Nth row decoder blocks and first to Nth word line blocks at the time of erasing of data of a 512-kbit cell array block, and time-dividing a data erase operation into first to Nth erase operations to effect the data erase operation, wherein the erase circuit sets all of the word lines to a preset potential, sets the potential of the selected source line individually selected from the first to Nth source lines to a first positive potential with respect to the word line potential, and sets the potentials of the non-selected source lines other than the selected source line to a second voltage having an absolute value smaller than the first positive voltage with respect to the word line potential.

(Fifth Embodiment)

Figure 31:
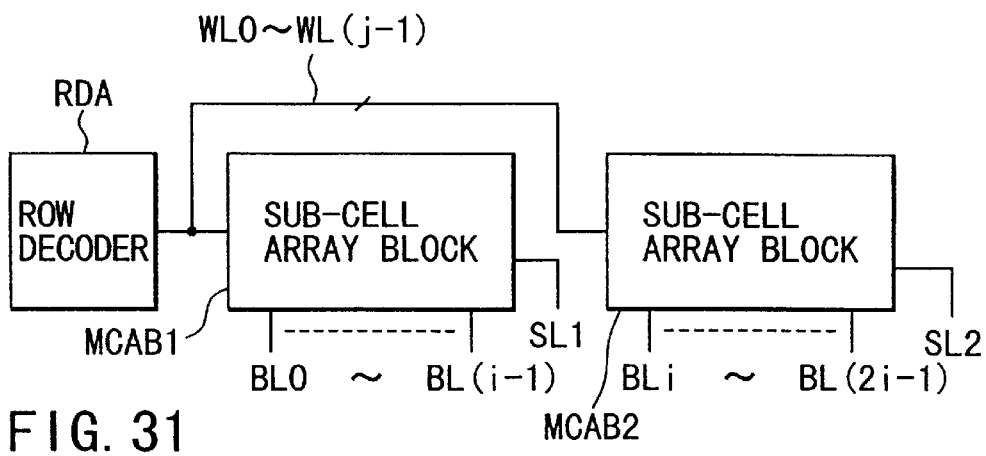
FIG. 31 is a circuit diagram showing a cell array block in a NOR type flash memory and a row decoder array associated therewith, for illustrating a nonvolatile semiconductor memory according to a fifth embodiment of this invention.

FIG. 31 is a circuit diagram showing a cell array block MCA in a NOR type flash memory and a row decoder array RDA associated therewith, for illustrating a nonvolatile semiconductor memory according to a fifth embodiment of this invention.

In the NOR type flash memory, the cell array block having a bit capacity of 512 kbits (64 kbytes) is divided into two sub-cell array blocks MCAB1, MCAB2 each having a bit capacity of 32 kbytes.

Each of the sub-cell array blocks MCAB1, MCAB2 commonly uses 512 word lines WL0 to WL(j−1). The sub-cell array block MCAB1 has 256 bit lines BL0 to BL(i−1) and one source line SL1 provided to extend in the bit line direction. The sub-cell array block MCAB2 has 256 bit lines BLi to BL(2i−1) and one source line SL2 provided to extend in the bit line direction.

Figure 32:
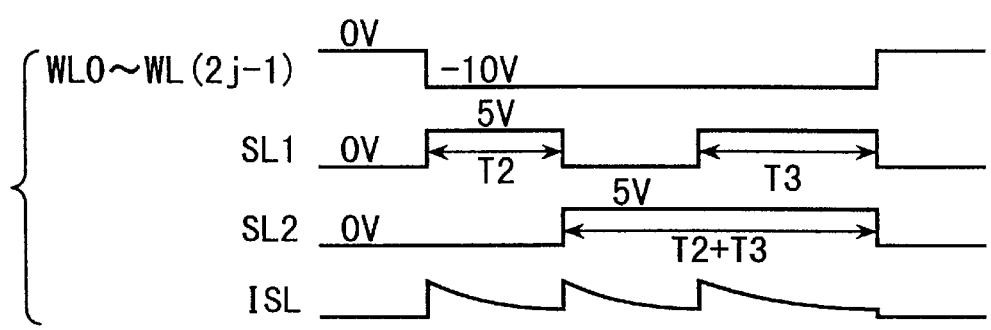
FIG. 32 is a timing chart for illustrating the erase operation of a cell array block in the circuit shown in FIG. 31.

FIG. 32 is a timing chart for illustrating the erase operation of the cell array block MCA in the circuit shown in FIG. 31.

When the operation is set into the erase mode, the sub-cell array blocks MCAB1, MCAB2 are first serially selected and a bias voltage (for example, 6.5 V) is separately applied to the source lines SL1, SL2 in a period of time T2 (<T1). Then, after the band-band current is reduced, a bias voltage is simultaneously applied to the source lines SL1, SL2 in a period of time T3 and a voltage of −10 V is applied to all of the word lines in a period from the start of the erase operation to the end thereof.

At this time, if the erase voltage booster circuit having a maximum supply current of 2 mA is provided, T2 and T3 can be respectively set to 2 ms and 8 ms as is understood from the characteristic shown in FIG. 8. As a result, the total erase time for the erase operation of the sub-cell array blocks MCAB1, MCAB2 is set to 2 ms×2+8 ms=12 ms and can be significantly reduced in comparison with the total erase time 20 ms required for the erase operation shown in FIG. 29.

Further, the waveform of the supply current ISL of the erase voltage booster circuit for biasing the source lines SL1, SL2 can be dispersed into three peak portions for the serial erase operation of the sub-cell array block of each group and the erase operation of the sub-cell array blocks of all of the groups, and therefore, the area required for the erase voltage booster circuit can be reduced.

Figure 33:
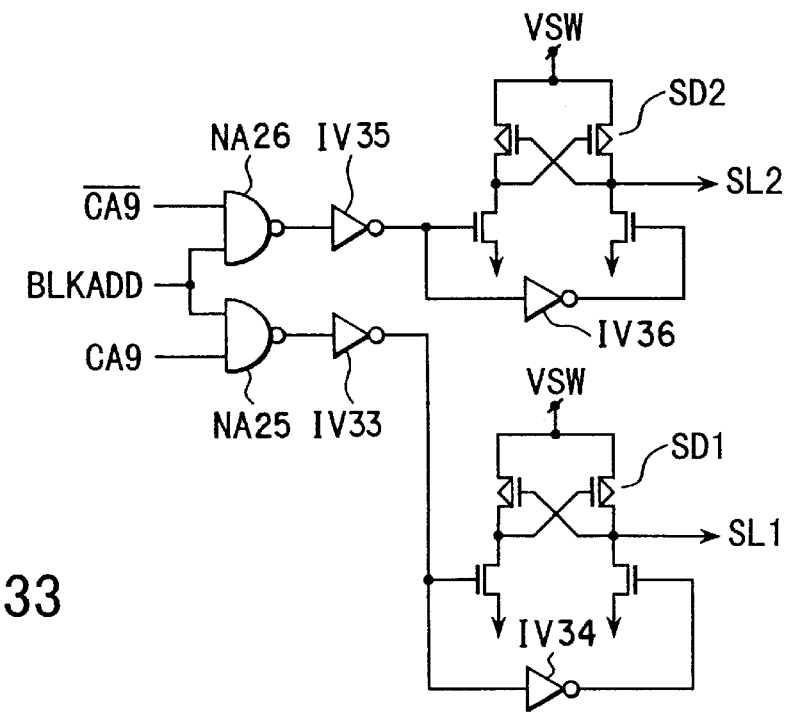
FIG. 33 is a circuit diagram showing an example of the construction of a source decoder for selecting two source lines in the circuit shown in FIG. 31.

FIG. 33 is a circuit diagram showing an example of the construction of a source decoder for selecting the two source lines SL1, SL2 in the circuit shown in FIG. 31.

Complementary internal column address signals CA9, $\overline{CA9}$ created from the most significant bit signal among the column address signal are respectively supplied to one-side input terminals of 2-input NAND gates NA25, NA26 and a block address signal BLKADD is supplied to the other input terminals of the NAND gates NA25, NA26. The output signal of the NAND gate NA25 is inverted by inverters IV33, IV34 and then input to a source line driver SD1 as complementary signals. Further, the output signal of the NAND gate NA26 is inverted by inverters IV35, IV36 and then input to a source line driver SD2 as complementary signals. The source line drivers SD1, SD2 are each constructed by a CMOS latch circuit connected between a source line voltage VSW node and a Vss node.

The operation of the source decoder is described below. At the erase time, the block address signal BLKADD is set to the "H" level and one of the source lines SL1 and SL2 of the sub-cell array blocks MCAB1 and MCAB2 is set to the source line voltage VSW by the "H" level of one of the complementary column address signals CA9 and $\overline{CA9}$. The signals CA9, $\overline{CA9}$ are inverted in one erase operation and the source lines SL1, SL2 are serially selected and set to the source line voltage VSW.

At the non-selected time or during the operation other than the erase operation, the block address signal BLKADD is set at the "L" level and the potentials of the two source lines SL1, SL2 are set to 0V.

By expanding and generally representing the content of the fifth embodiment, a nonvolatile semiconductor memory is obtained which includes erase circuit for dividing a source line into first to Nth ($\geq 2$) source lines at the time of erasing of data of a 512-kbit cell array block, individually selecting the first to Nth source lines to time-divide a data erase operation into first to Nth erase operations and effect the data erase operation, and then simultaneously erasing data of all of the memory cells, wherein the erase circuit enables the selection logic for the pre-decode signal to set all of the row decoders into a selected state and set the potentials of all of the word lines to a preset potential, sets the potential of the selected source line individually selected from the first to Nth source lines to a first positive voltage with respect to the word line potential and sets the potentials of all of the non-selected source lines other than the selected source line to a second voltage having an absolute value smaller than the first positive voltage with respect to the word line potential in a case where the first to Nth source lines are individually selected to erase data, and sets the potentials of all of the source lines to the first positive voltage with respect to the word line potential with all of the word lines kept at the preset potential.

In the cell array block and row decoder array in the fourth embodiment shown in FIG. 28, the erase operation effected by use of the signal waveforms shown in FIG. 32 can be attained. Further, in the cell array block and row decoder array in the fifth embodiment shown in FIG. 31, the erase operation effected by use of the signal waveforms shown in FIG. 29 can be attained.

(Sixth Embodiment)

Figure 34:
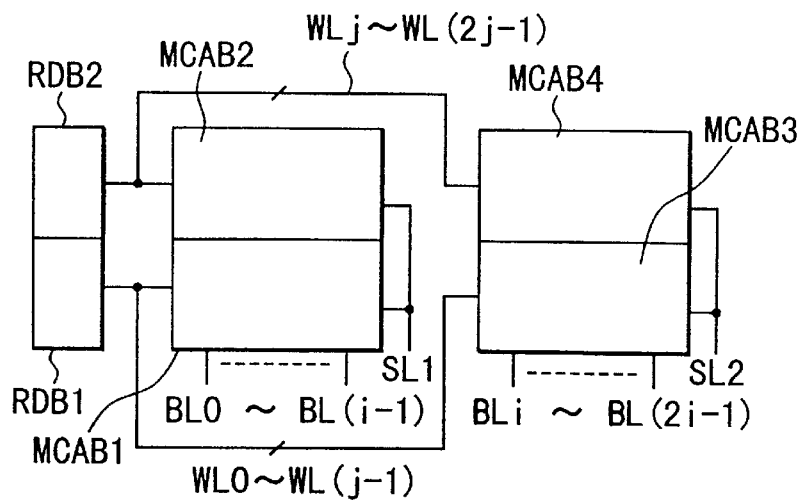
FIG. 34 is a circuit diagram showing a cell array block in a NOR type flash memory and a row decoder array associated therewith, for illustrating a nonvolatile semiconductor memory according to a sixth embodiment of this invention.

FIG. 34 is a circuit diagram showing a cell array block MCA in a NOR type flash memory and a row decoder array associated therewith, for illustrating a nonvolatile semiconductor memory according to a sixth embodiment of this invention.

In the NOR type flash memory, the cell array block having a bit capacity of 512 kbits (64 kbytes) is divided into four sub-cell array blocks MCAB1, MCAB2, MCAB3, MVAB4 each having a bit capacity of 16 kbytes.

The two sub-cell array blocks MCAB1, MCAB2 arranged on the first column commonly use 256 bit lines BL0 to BL(i−1) and one source line SL1 and the two sub-cell array blocks MCAB3, MCAB4 arranged on the second column commonly use 256 bit lines BLi to BL(2i−1) and one source line SL2. The two sub-cell array blocks MCAB1, MCAB3 arranged on the first row commonly have 256 lines WL0 to WL(j−1) and the two sub-cell array blocks MCAB2, MCAB4 arranged on the second row commonly have 256 lines WLj to WL(2j−1).

The row decoder array is divided into two row decoder blocks RDB1, RDB2 respectively corresponding to the 2-row sub-cell array blocks (MCAB1, MCAB3), (MCAB2, MCAB4). Each of the row decoder blocks RDA1, RDA2 has 256 row decoders RD and is selectively set to the selected or non-selected state by the block selection signal R0, R1 at the erase time.

Figure 35:
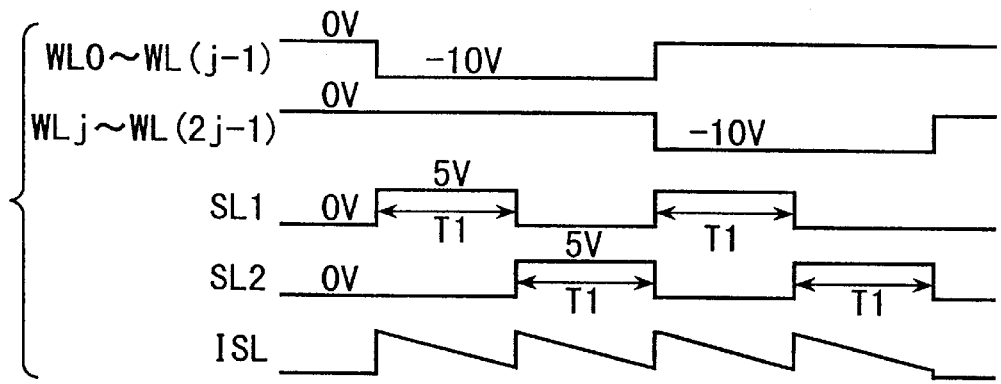
FIG. 35 is a timing chart for illustrating the erase operation of a cell array block in the circuit shown in FIG. 34.

FIG. 35 is a timing chart for illustrating the erase operation of the cell array block MCA in the circuit shown in FIG. 34.

When the operation is set into the erase mode, the sub-cell array blocks (MCAB1, MCAB3) on the first row are first selected and a voltage of −10V is applied to the word lines WL0 to WL(j−1), and in this state, the source lines SL1, SL2 are serially selected for a period of time T1, a bias voltage (for example, 6.5 V) is applied to the selected source line and 0V is applied to the non-selected source line. During this time, 0V is applied to the non-selected word lines WLj to WL(2j−1).

Next, the sub-cell array blocks (MCAB2, MCAB4) on the second row are selected and a voltage of −10V is applied to the word lines WLj to WL(2j−1), and in this state, the source lines SL1, SL2 are serially selected for a period of time T1. At this time, a bias voltage (for example, 6.5V) is applied to the selected source line and 0V is applied to the non-selected source line. During this time, 0V is applied to the non-selected word lines WL0 to WL(j−1).

As a result, data in the sub-cell array blocks MCAB1, MCAB3, MCAB2, MCAB4 is serially erased.

Therefore, the total erase time required for the erase operation becomes 40 ms and the waveform of the supply current ISL of the erase voltage booster circuit for biasing the source lines SL1, SL2 can be dispersed into four peak portions, and therefore, an erase voltage booster circuit having the maximum supply current of 1 mA can be used and the area required for the erase voltage booster circuit can be reduced.

By expanding and generally representing the content of the sixth embodiment, a nonvolatile semiconductor memory is obtained which includes erase circuit for dividing word lines into first to Mth ($\geq 2$) word line blocks and dividing a source line into first to Nth ($\geq 2$) source lines at the time of erasing of data of a 512-kbit cell array block, and individually selecting (1, 1)th to (M, N)th blocks each depending on the combination of an individually selected one of the first to Mth word line blocks and an individually selected one of the first to Nth source lines to time-divide a data erase operation into (1, 1)th to (M, N)th erase operations and effect the data erase operation, wherein the erase circuit enables the selection logic for the pre-decode signal to set all of the row decoders corresponding to the selected word line block into a selected state, sets the potentials of all of the word lines of the selected word line block to a first voltage, sets the potentials of all of the word lines of the non-selected word line block to a second voltage higher than the first voltage, sets the potential of the selected source line to a third voltage higher than the first voltage and sets the potential of the non-selected source line to a fourth voltage lower than the third voltage.

(Seventh Embodiment)

Figure 36:
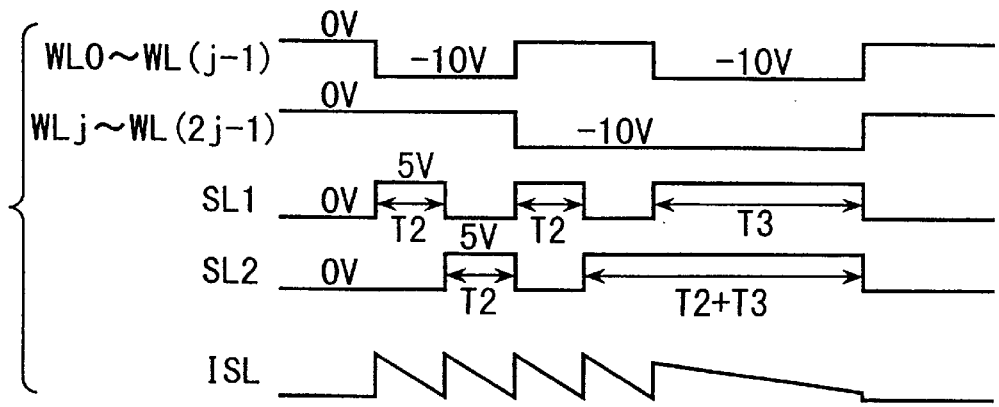
FIG. 36 is a timing chart showing the erase operation of a cell array block, for illustrating a nonvolatile semiconductor memory according to a seventh embodiment of this invention.

FIG. 36 is a timing chart showing the erase operation of a cell array block MCA, for illustrating a nonvolatile semiconductor memory according to the seventh embodiment of this invention. The seventh embodiment is similar to the sixth embodiment shown in FIGS. 34 and 35, but the sequence of application of the signals in the erase operation is different.

When operation is set into the erase mode, a source line bias voltage is serially applied to the source lines for a period of time T2 (<T1) in the same sequence as that in the case of erase operation shown in FIG. 35. Then, after the band-band current is reduced, a voltage of −10 V is applied to all of the word lines WL0 to WL(j−1), WLj to WL(2j−1) and a source line bias voltage is applied to all of the source lines SL1, SL2 for a period of time T3 to the end of the erase operation.

At this time, if an erase voltage booster circuit having a maximum supply current of 1 mA is provided, T2 and T3 can be respectively set to 2 ms and 8 ms as is understood from the characteristic shown in FIG. 8.

As a result, the total erase time for the erase operation of the sub-cell array blocks MCAB1, MCAB2 is set to 2 ms×4+8 ms=16 ms and can be significantly reduced in comparison with the total erase time 40 ms required for the erase operation shown in FIG. 35.

Further, the waveform of the supply current ISL of the erase voltage booster circuit for biasing the source lines SL1, SL2 can be dispersed into five peak portions for the serial erase operation of the sub-cell array block of each group and the erase operations of the sub-cell array blocks of all of the groups, and therefore, the area required for the erase voltage booster circuit can be reduced.

By expanding and generally representing the content of the seventh embodiment, a nonvolatile semiconductor memory is obtained which includes erase circuit for dividing word lines into first to Mth ($\geq 2$) word line blocks and dividing a source line into first to Nth ($\geq 2$) source lines at the time of erasing of data of a 512-kbit cell array block, individually selecting (1, 1)th to (M, N)th blocks each depending on the combination of an individually selected one of the first to Mth word line blocks and an individually selected one of the first to Nth source lines to time-divide a data erase operation into (1, 1)th to (M, N)th erase operations and effect the data erase operation, and simultaneously erasing data for all of the memory cells, wherein the erase circuit enables the selection logic for the pre-decode signal to set all of the row decoders corresponding to the selected word line block into a selected state, sets the potentials of all of the word lines of the selected word line block to a first voltage, sets the potentials of all of the word lines of the non-selected word line block to a second voltage higher than the first voltage, sets the potential of the selected source line to a third voltage higher than the first voltage and sets the potential of the non-selected source line to a fourth voltage lower than the third voltage in a case where the (1, 1)th to (M, N)th blocks are individually selected to erase data, and sets the potentials of all of the word lines to the first voltage and sets the potentials of all of the source lines to the third voltage in a case where data of all of the memory cells is simultaneously erased.

Next, the data programming test in the NOR type flash memory is explained below.

In the normal data programming operation, data is programmed into one of the memory cells or data is simultaneously programmed into a plurality of memory cells of the same cell array block. On the other hand, at the time of data programming test, data is simultaneously programmed into a plurality of memory cells of a plurality of cell array blocks.

(Eighth Embodiment)

Figure 37:
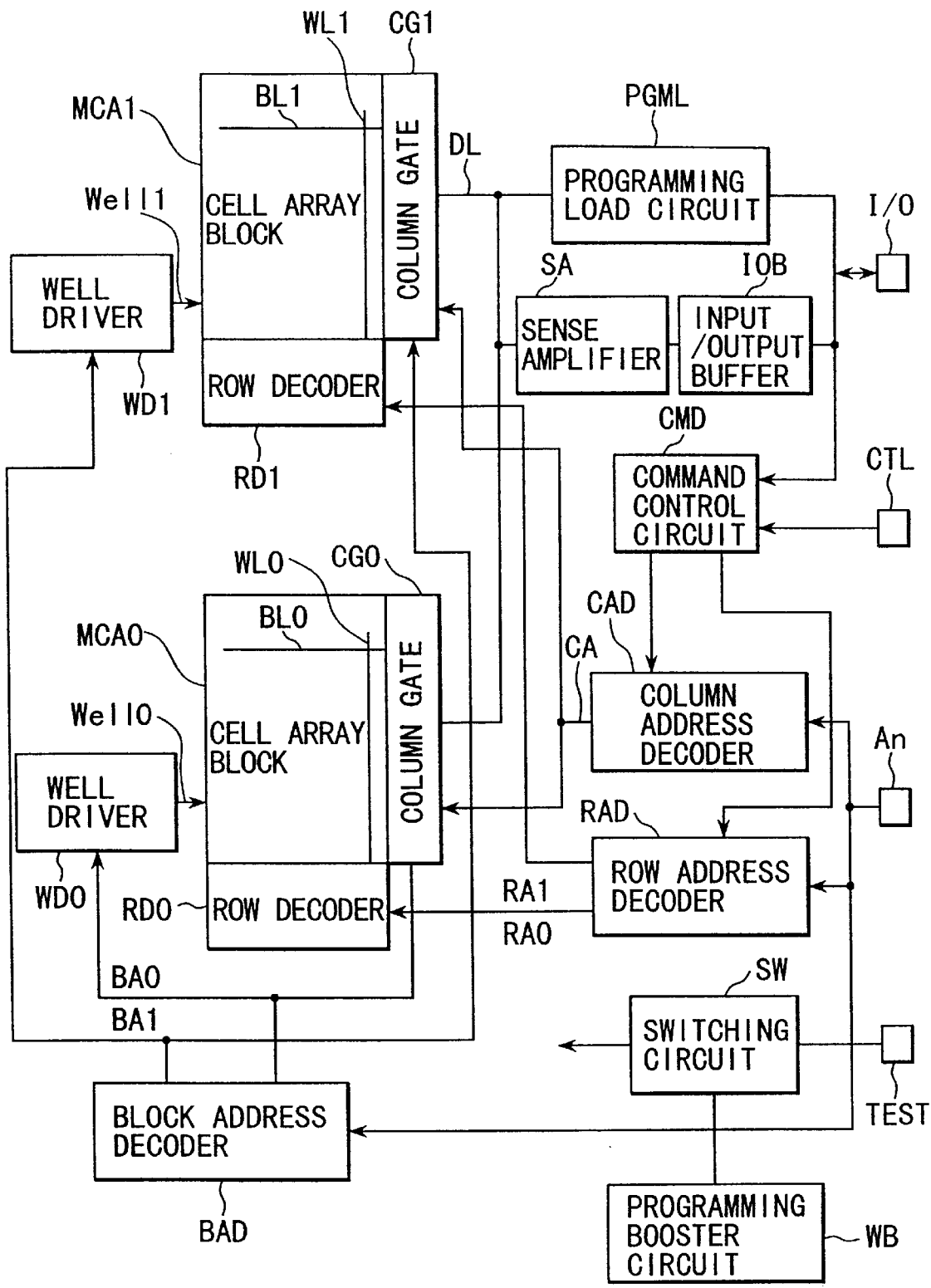
FIG. 37 is a circuit diagram showing an example of the construction of a NOR type flash memory, for illustrating a nonvolatile semiconductor memory according to an eighth embodiment of this invention.

FIG. 37 shows an example of the construction of a NOR type flash memory, for illustrating a nonvolatile semiconductor memory according to an eighth embodiment of this invention.

A memory core section includes two cell array blocks MCA0, MCA1 in which memory cells are arranged, word line selection row decoders RD0, RD1 respectively provided for the cell array blocks MCA0, MCA1, and bit line selection column gates CG0, CG1 respectively provided for the cell array blocks MCA0, MCA1.

For simplifying the drawing, the cell array block MCA0 is typically shown as having one word line WL0 and one bit line BL0 and the cell array block MCA1 is typically shown as having one word line WL1 and one bit line BL1, for example.

A block address decoder BAD decodes a block address signal input via an address pin An to output block selection signals BA0, BA1. The enabled/disabled states of well drivers WD0, WD1 are controlled by the block selection signals BA0, BA1 and the well drivers apply preset voltages to P-type well wiring lines Well0, Well1 of the cell array blocks MCAB0, MCAB1. A row address decoder RAD decodes a row address signal input via the address pin An to output row decoder selection signals RA0, RA1 for controlling the enabled and disabled states of the row decoders RD0, RD1. When enabled, each of the row decoders RD0, RD1 drives a specified word line of the cell array blocks MCA0, MCA1 in response to the row address signal.

The row decoders RD0, RD1 may be so constructed that the enabled and disabled states thereof can be controlled not only by the row decoder selection signals RA0, RA1 but also by the block selection signals BA0, BA1.

A column address decoder CAD decodes a column address signal input via the address pin An to output a column selection signal CA for controlling the selection/non-selection of a specified column of the column gates CG0, CG1. The enabled/disabled states of the column gates CG0, CG1 are respectively controlled by the block selection signals BA0, BA1 and each of the column gates selects a bit line on the specified column of the cell array blocks MCAB0, MCAB1 in response to the column selection signal CA. A data line DL is commonly connected to the column gates CG0, CG1 and connected to the bit lines of the cell array blocks MCA0, MCA1 via the column gates CG0, CG1. A sense amplifier SA senses and amplifies a voltage depending on cell data read out on the data line DL from the memory cell selected at the time of data readout. An input/output buffer IOB outputs output data of the sense amplifier SA from an input/output pin IO to the exterior.

A programming load circuit PGML is controlled by programming data input via the input/output pin IO at the time of data programming, biases the data line DL to 5V at the "0" programming time and biases the data line DL to 0V at the "1" programming time.

A command control circuit CMD specifies an operation such as a programming, erase or readout operation according to signals input via a control pin CTL and the input/output pin IO and outputs mode control signals to the row address decoder RAD and column address decoder CAD. A programming high voltage switching circuit SW selects a raised voltage of the programming voltage booster circuit WB in the normal programming mode and selects a programming high voltage applied to the programming test external terminal TEST from the exterior and supplies the voltage to a preset internal circuit.

FIG. 38 schematically shows an example of the construction of the two cell array blocks MCA0, MCA1 and two column gates (column selection transistors and block selection transistors) in the circuit shown in FIG. 37.

For simplifying the drawing, the cell array block MCA0 is shown to have two cells on the same row, a word line WL0 commonly connected to the control gates of the cells on the same row and bit lines each commonly connected to the cells on the same column, for example, and one of the cells on one column is denoted by a symbol Cell0 and the bit line on the column is denoted by a symbol BL0.

As the column gate for the cell array block MCA0, two column gates on two columns selected by column selection signals Y0, Yn are shown as an example. On each column, a column selection transistor CS and a block selection transistor BS selected by a block selection signal BA0 are serially connected to a corresponding bit line.

Likewise, the cell array block MCA1 is shown to have two cells on the same row, a word line WL1 commonly connected to the control gates of the cells on the same row and bit lines each commonly connected to the cells on the same column, for example, and one of the cells on one column is denoted by a symbol Cell1 and the bit line on the column is denoted by a symbol BL1. As the column gate for the cell array block MCA1, two column gates on two columns selected by the column selection signals Y0, Yn are shown as an example, and on each column, a column selection transistor CS and a block selection transistor BS selected by a block selection signal BA1 are serially connected to a corresponding bit line.

FIG. 39 schematically shows an example of the construction of two cell array blocks MCA0, MCA1, two column gates (column selection transistors and block selection transistors) CG0, CG1 and a row main decoder RMD for selecting and controlling the two row decoders RD0, RD1 in the circuit shown in FIG. 37.

For simplifying the drawing, the cell array block MCAB0 is shown to include a cell Cell0 of one row and one column, one word line WL0 among the word lines (sub-word lines) and one bit line BL0 among the bit lines as a representative example. As the column gate CG0, a block selection transistor BS and a column selection transistor CS serially connected to the bit line BL0 are shown as a representative example.

The row decoder RD0 includes one block selection signal line (column gate selection signal line) BA0, one CMOS transfer gate (only one CMOS transfer gate is shown as a representative) TG, and a noise canceling NMOS transistor NT. The CMOS transfer gate TG is connected between the block selection signal line BA0 and a corresponding one of the sub-word lines of the cell array block MCA0. The NMOS transistor NT is connected between a corresponding one of the sub-word lines of the cell array block MCAB0 and the ground node.

Likewise, the cell array block MCAB1 is shown to include a cell Cell1 of one row and one column, one word line WL1 among the word lines (sub-word lines) and one bit line BL1 among the bit lines as a representative example. As the column gate CG1, a block selection transistor BS and a column selection transistor CS serially connected to the bit line BL1 are shown as a representative example.

The row decoder RD1 includes one block selection signal line (column gate selection signal line) BA1, one CMOS transfer gate (only one CMOS transfer gate is shown as a representative) TG, and a noise canceling NMOS transistor NT. The CMOS transfer gate TG is connected between the block selection signal line BA1 and a corresponding one of the word lines of the cell array block MCA1. The NMOS transistor NT is connected between a corresponding one of the sub-word lines of the cell array block MCAB1 and the ground node.

The row main decoder RMD decodes 2-bit internal row address signals RAi, $\overline{RAi}$, selectively controls the CMOS transfer gates TG connected to the corresponding sub-word lines of the two cell array blocks MCA0, MCA1 by the decoded outputs (complementary row main decode signals Mij, $\overline{Mij}$) thereof and drives the noise canceling NMOS transistors NT respectively connected to the sub-word lines of the two cell array blocks MCA0, MCA1 by use of the row main decode signal $\overline{Mij}$.

In the NOR type flash memory according to the eighth embodiment, one or a plurality of cells in one of the two cell array blocks MCA0, MCA1 are simultaneously selected at the time of data readout/programming/erase, and one or a plurality of cells in the two cell array blocks MCA0, MCA1 are simultaneously selected at the time of programming test.

Figure 40:
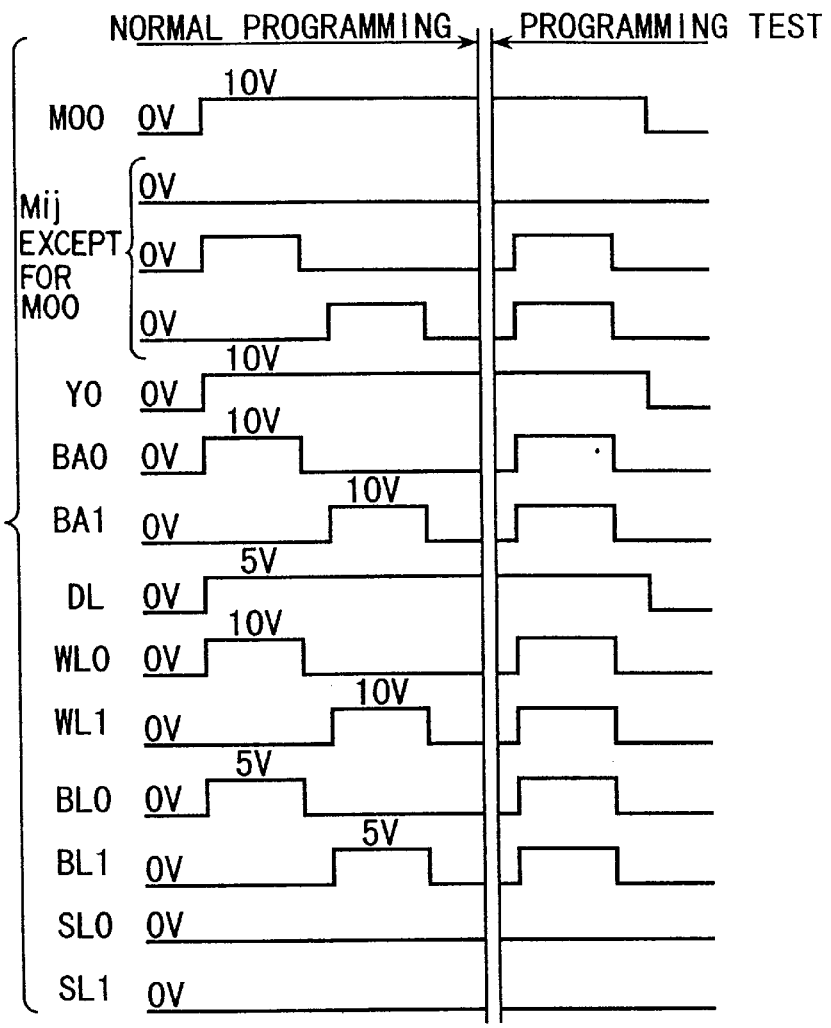
FIG. 40 is a timing chart showing the normal programming operation and programming test operation in the operation of the circuit shown in FIG. 39.

FIG. 40 is a timing chart showing the normal programming operation and programming test operation in the circuit shown in FIG. 39.

In the normal programming operation in the NOR type flash memory, one of the block address signals BA0 and BA1 is set into the selected state and the other block address signal is set into the non-selected state. As a result, a cell in one of the blocks set in the selected state is selected and all of the cells in the other block set in the non-selected state are set into the non-selected state.

That is, in a case where the cell Cell0 in the cell array block MCA0 is a cell to be programmed in the normal programming operation, for example, the block selection signal BA0 is set into the enabled state ("H") in order to select the cell array block MCA0 and the other block selection signal BA1 is set into the disabled state ("L").

Then, in order to select the gate of the cell Cell0, a signal M00 among the row main decode signals Mij which corresponds to the sub-word lines WL0, WL1 is set to "H" and the other signals Mij are set to "L". In this case, the sub-word line WL0 is selected since the block selection signal BA0 is set at "H", but the sub-word line WL1 is not selected since the block selection signal BA1 is set at "L". Further, in order to select the dra in of the cell Cell0, the signal Y0 among the column selection signal which corresponds to the bit line BL0 is set into the enabled state ("H") and the other signals are set into the disabled state ("L")

That is, the bit line BL0 of the cell array block MCA0 among the bit lines (in this example, BL0, BL1) of the same column address of the two cell array blocks MCAB0, MCAB1 is selected by the block selection signal BA0 and column selection signal Y0 and connected to the data line DL and the bit line BL1 of the cell array block MCA1 is not selected.

Therefore, since the drain of the selected cell Cell0 connected to the selected bit line BL0 in the cell array block MCA0 is biased by the programming load circuit PGML and the gate thereof (sub-word line WL0) is selected, data can be programmed into the cell.

At the time of programming test, the block selection signals BA0, BA1 are set into the selected state and the row decoders RD0, RD1 are enabled by the row decoder selection signals RA0, RA1 to select the sub-word lines (in this example, WL0, WL1) of the same row of the cell array blocks MCA0, MCA1 according to the row address signal. Further, the bit lines (in this example, BL0, BL1) of the same column address of the two cell array blocks MCA0, MCA1 are selected by the block selection signal BA0 and column selection signal Y0 and by the block selection signal BA1 and column selection signal Y0 and connected to the data line DL.

Therefore, since the drains of the selected cells Cell0, Cell1 respectively connected to the selected bit lines BL0, BL1 in the cell array blocks MCA0, MCA1 are biased by the programming load circuit PGML and the gates thereof (sub-word lines WL0, WL1) are selected, test data can be simultaneously programmed.

At this time, since 0V is applied to the well wiring lines Well0, Well1 (source line and well line) from the well drivers WD0, WD1 in the cell array blocks MCAB0, MCAB1, a problem that the source line potential or well potential is set into an electrically floating state will not occur.

As a result, since the number of bits which can be simultaneously programmed can be increased in comparison with the conventional case, the programming test time can be reduced in inverse proportion to the number of blocks. Thus, it is possible to suppress an increase in the programming test time which becomes significant in the memory with large capacity.

Figure 41:
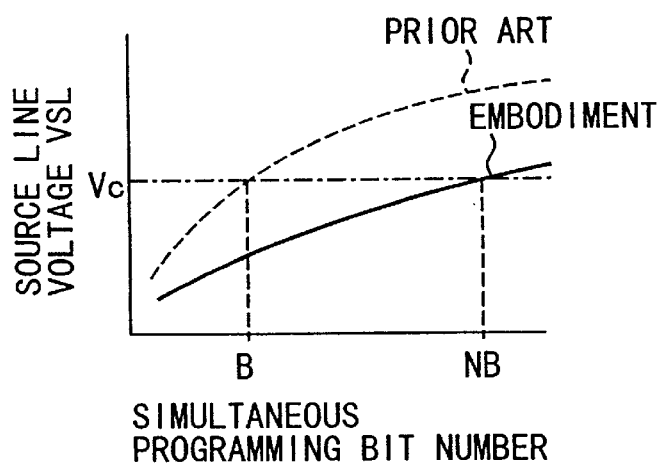
FIG. 41 is a characteristic diagram showing the relation between the simultaneous programming bit number and the critical source line voltage in a NOR type flash memory according to the eighth embodiment of this invention.

FIG. 41 shows the relation between the simultaneous programming bit number and the critical source line voltage Vc in the above NOR type flash memory by use of a solid line and the relation between the simultaneous programming bit number and the critical source line voltage Vc in the conventional NOR type flash memory by use of broken lines for comparison with the above case.

As is clearly seen from FIG. 41, according to the NOR type flash memory of the eighth embodiment, since the number of cell array blocks of memory cells to be simultaneously programmed is increased by plural (N) times, the number of bits which can be simultaneously programmed can be increased to N times the bit number B of the prior art case and the programming test time can be reduced. Further, the simultaneously programming bit number at which the critical source line voltage Vc is reached can be increased by a multiple of the number of blocks not only by increasing the number of simultaneously programming bits in a single block but also by simultaneously selecting a plurality of blocks (in this case, the block selection signals BA0, BA1 are set to "H").

The eighth embodiment is explained by taking the NOR type flash memory as the nonvolatile semiconductor memory as an example, but this invention can be effectively applied to a multi-value memory in which the test time is more important and a logic device having the above nonvolatile memories. Further, the simultaneous programming operation is not limited to the programming test operation and can be effected for a plurality of cell array blocks in the normal programming operation.

As described above, according to this invention, there is provided a nonvolatile semiconductor memory capable of reducing the programming time and suppressing the area required for the programming voltage booster circuit and the consumption current by programming bits while increasing the number of programming bits with the progress of programming when programming bits of the bit width are programmed into a plurality of memory cells of the same cell array block.

Further, there is provided a nonvolatile semiconductor memory capable of reducing the supply current of an erase voltage booster circuit to a value smaller than the initial value of a band-band tunnel current in the case of simultaneous erasing and suppressing the area required for the erase voltage booster circuit and the consumption current by diving a selected cell array block into groups and serially effecting the erase operation for the groups.

Also, there is provided a nonvolatile semiconductor memory capable of alleviating the restriction on the number of bits simultaneously programmed, reducing the programming test time, for example, and suppressing the test cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:

a plurality of word lines;

a plurality of bit lines;

at least one source line;

a plurality of nonvolatile memory cells each of which includes a gate electrode, drain electrode and source electrode and in each of which the gate electrode is connected to a corresponding one of said plurality of word lines, the drain electrode is connected to a corresponding one of said plurality of bit lines and the source electrode is connected to said source line;

a row decoder for selecting one of said plurality of word lines at the time of data programming;

a cell selection circuit connected to the bit lines, and for simultaneously selecting any number of bit lines from said plurality of bit lines, said cell selection circuit including a column decoder and column gates; and programming circuit for increasing the number of programming bits with the progress of programming when data of a plurality of bits is programmed into a plurality of memory cells which are simultaneously selected by said cell selection circuit, the programming circuit connected to the column gates.

2. The nonvolatile semiconductor memory according to claim 1, which further comprises a plurality of data lines provided for the bit lines, respectively, and connected thereby the column gates, and in which:

said column decoder outputs signals for selecting at least one of the bit lines to achieve data programming;

said column gates connect the selected ones of the bit lines to the corresponding data lines, said programming circuit has first programming loads and second programming loads provided for the data lines respectively, each first programming load connected to receive a first select signal and each second programming load connected to receive a second select signal;

said first and second signals assumes a first state wherein the first and second select signals are at first and second logic levels, respectively, a second state wherein the first and second select signals are at the second and first logic levels, respectively, or a third state the first and second select signals are both at the first logic level; and said first and second programming load apply programming voltages to the data lines when the first and second select signals assumes the first state.

3. The nonvolatile semiconductor memory according to claim 2, wherein the first state and second state are same period, and third state is longer than the first state and second state.

4. The nonvolatile semiconductor memory according to claim 1, wherein said programming circuit programs data by dividing the plurality of memory cells simultaneously selected into N ($\geq 2$) groups and dividing a programming period into at least two periods of a first programming period in which data is serially programmed in first time with the memory cells of each group set as one unit and a second programming period in which data is serially programmed in second time with the memory cells of at least two groups set as one unit.

5. The nonvolatile semiconductor memory according to claim 4, wherein the second time is longer than the first time.

6. The nonvolatile semiconductor memory according to claim 1, wherein the first programming period is a period of time in which the programming current of the memory cell is reduced to substantially half the initial value thereof.

* * * * *